(12) United States Patent
Pisharodi

(10) Patent No.: US 10,439,552 B2
(45) Date of Patent: Oct. 8, 2019

(54) PHOTOVOLTAIC SYSTEMS WITH INTERMITTENT AND CONTINUOUS RECYCLING OF LIGHT

(71) Applicant: Madhavan Pisharodi, Brownsville, TX (US)

(72) Inventor: Madhavan Pisharodi, Brownsville, TX (US)

(73) Assignee: Perumala Corporation, Brownsville, TX (US)

( * ) Notice: Subject to any disclaimer, the term of this patent is extended or adjusted under 35 U.S.C. 154(b) by 0 days.

(21) Appl. No.: 15/149,506

(22) Filed: May 9, 2016

(65) Prior Publication Data

US 2016/0254781 A1    Sep. 1, 2016

Related U.S. Application Data

(63) Continuation-in-part of application No. 15/069,591, filed on Mar. 14, 2016, which is a
(Continued)

(51) Int. Cl.
    *H02S 40/22* (2014.01)
    *H02S 30/10* (2014.01)
(Continued)

(52) U.S. Cl.
    CPC ...... *H02S 40/22* (2014.12); *H01L 31/035281* (2013.01); *H01L 31/042* (2013.01);
(Continued)

(58) Field of Classification Search
    CPC ............... H01L 31/0547; H01L 31/054; H01L 31/035281; H02S 40/22; H02S 20/30; H02S 30/10
(Continued)

(56) References Cited

U.S. PATENT DOCUMENTS 4,080,221 A * 3/1978 Manelas .................... F24J 2/10
    126/684
4,200,472 A   4/1980 Chappell et al.
(Continued)

FOREIGN PATENT DOCUMENTS

FR       2961023      12/2011
JP      2010087504 A   4/2010

OTHER PUBLICATIONS

Written opinion and search report dated Aug. 21, 2015 for co-pending PCT patent application No. PCT/US15/32615.
(Continued)

*Primary Examiner* — Allison Bourke
(74) *Attorney, Agent, or Firm* — D'Ambrosio & Menon, PLLC; Usha Menon

(57) ABSTRACT

Photovoltaic systems and methods for optimizing the harvesting of solar energy are disclosed. The photovoltaic system includes: a housing; and a solar panel assembly supported within the housing. The solar panel assembly comprises: one or more solar panels; and a plurality of elongate tubes for receiving the solar panels. The tubes are stacked perpendicular to a base of the housing. Recycling of incident light is facilitated within each of these tubes. The light is intermittently or continuously recycled.

10 Claims, 28 Drawing Sheets

Related U.S. Application Data continuation-in-part of application No. 14/506,232, filed on Oct. 3, 2014, now Pat. No. 9,287,428.

(60) Provisional application No. 62/003,790, filed on May 28, 2014, provisional application No. 62/039,704, filed on Aug. 20, 2014.

(51) Int. Cl.
| | |
|---|---|
| *H01L 31/0352* | (2006.01) |
| *H01L 31/042* | (2014.01) |
| *H01L 31/054* | (2014.01) |
| *H02S 20/32* | (2014.01) |
| *H01L 31/05* | (2014.01) |
| *H01L 31/043* | (2014.01) |
| *H01L 31/056* | (2014.01) |
| *H02S 40/44* | (2014.01) |

(52) U.S. Cl.
CPC ........ *H01L 31/054* (2014.12); *H01L 31/0547* (2014.12); *H02S 30/10* (2014.12); *H01L 31/043* (2014.12); *H01L 31/05* (2013.01); *H01L 31/056* (2014.12); *H02S 20/32* (2014.12); *H02S 40/44* (2014.12); *Y02E 10/52* (2013.01); *Y02E 10/60* (2013.01)

(58) Field of Classification Search
USPC ........................................ 136/246
See application file for complete search history.

(56) References Cited

U.S. PATENT DOCUMENTS

| | | | |
|---|---|---|---|
| 4,224,082 A | 9/1980 | Jacobson | |
| 4,368,415 A | 1/1983 | Henderson et al. | |
| 5,009,243 A | 4/1991 | Barker | |
| 6,005,185 A | 12/1999 | Tange | |
| 6,224,016 B1 | 5/2001 | Lee et al. | |
| 6,369,316 B1 | 4/2002 | Plessing et al. | |
| 6,515,217 B1 | 2/2003 | Aylaian | |
| 6,586,668 B2 | 7/2003 | Shugar | |
| 6,689,949 B2 | 2/2004 | Ortabasi | |
| 7,196,292 B2 | 3/2007 | Gronet | |
| 7,259,322 B2 | 8/2007 | Gronet | |
| 7,380,549 B1 | 6/2008 | Ratliff | |
| 7,394,016 B2 | 7/2008 | Gronet | |
| 8,266,847 B2 | 9/2012 | Edgar | |
| 8,571,754 B2 | 10/2013 | Brown et al. | |
| 2004/0211458 A1 | 10/2004 | Gui | |
| 2006/0180197 A1 | 8/2006 | Gui | |
| 2007/0084500 A1* | 4/2007 | Chen | F16M 11/14 136/244 |
| 2007/0169804 A1 | 7/2007 | Nakata | |
| 2008/0308151 A1 | 12/2008 | Den Boer | |
| 2009/0120486 A1 | 5/2009 | Buller | |
| 2010/0078056 A1 | 4/2010 | Hovel | |
| 2010/0242517 A1 | 9/2010 | Johnson | |
| 2010/0326493 A1 | 12/2010 | Sherman | |
| 2011/0023939 A1 | 2/2011 | Chen et al. | |
| 2011/0030766 A1 | 2/2011 | Son et al. | |
| 2011/0240084 A1 | 10/2011 | Lai et al. | |
| 2011/0253200 A1 | 10/2011 | Shtein | |
| 2012/0048340 A1* | 3/2012 | Qadir | F24J 2/38 136/246 |
| 2012/0055536 A1 | 3/2012 | Saito | |
| 2012/0097212 A1* | 4/2012 | McCoy, Jr. | H02S 40/22 136/246 |
| 2012/0167492 A1 | 7/2012 | Cummings | |
| 2013/0112241 A1 | 5/2013 | Gerritsen et al. | |
| 2014/0069486 A1 | 3/2014 | Snidow | |
| 2014/0246075 A1 | 9/2014 | Goldsby | |
| 2016/0099362 A1* | 4/2016 | Bellette | H01L 31/048 136/246 |

OTHER PUBLICATIONS

USPTO Office Action dated May 9, 2015 issued for parent U.S. Appl. No. 14/506,232.
USPTO Office Action dated Sep. 30, 2015 issued for parent U.S. Appl. No. 14/506,232.
USPTO NonFinal Office Action dated Aug. 12, 106 issued for co-pending related U.S. Appl. No. 15/069,591.
Written opinion and search report dated Jul. 17, 2017 for related co-pending PCT patent application No. PCT/US17/22075.
Office Action dated Mar. 25, 2019 for related co-pending Indian application No. 201637039963.

* cited by examiner

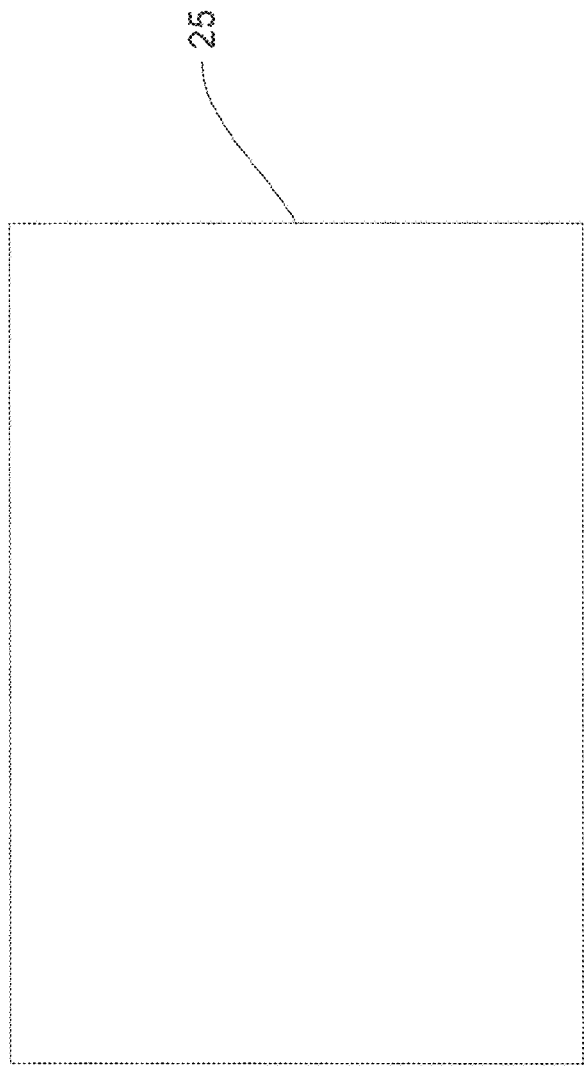
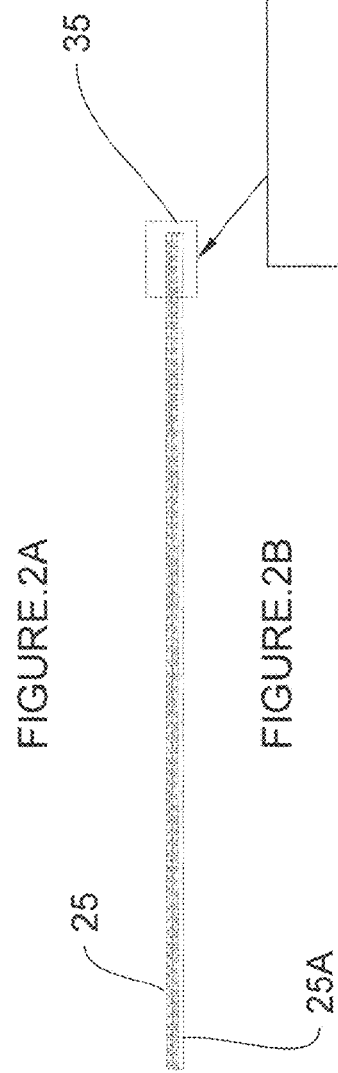
FIGURE.2A
FIGURE.2B

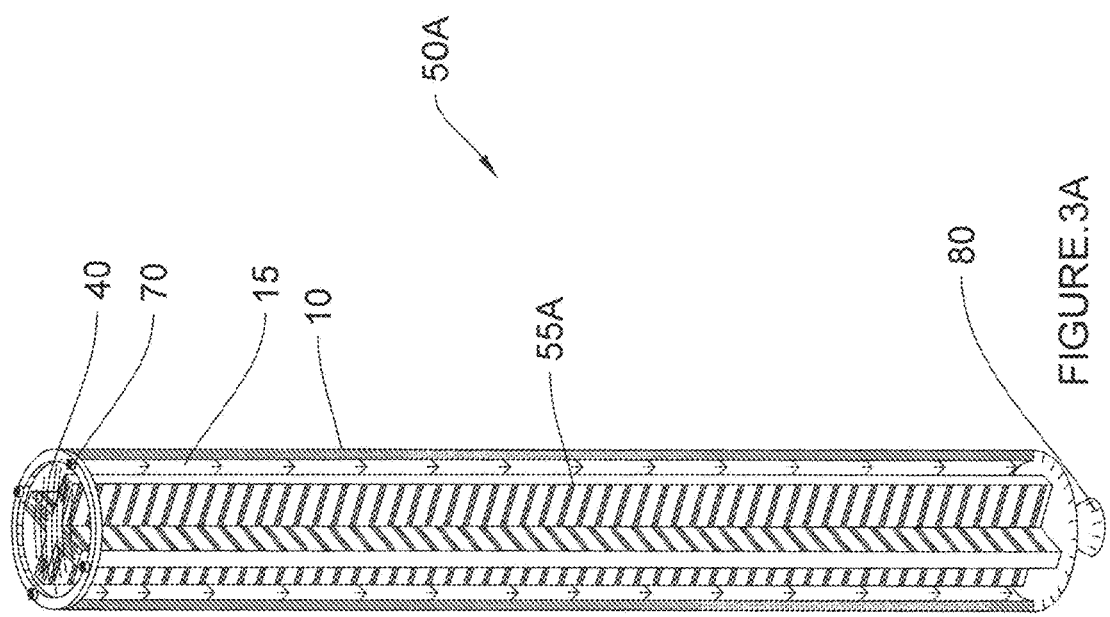

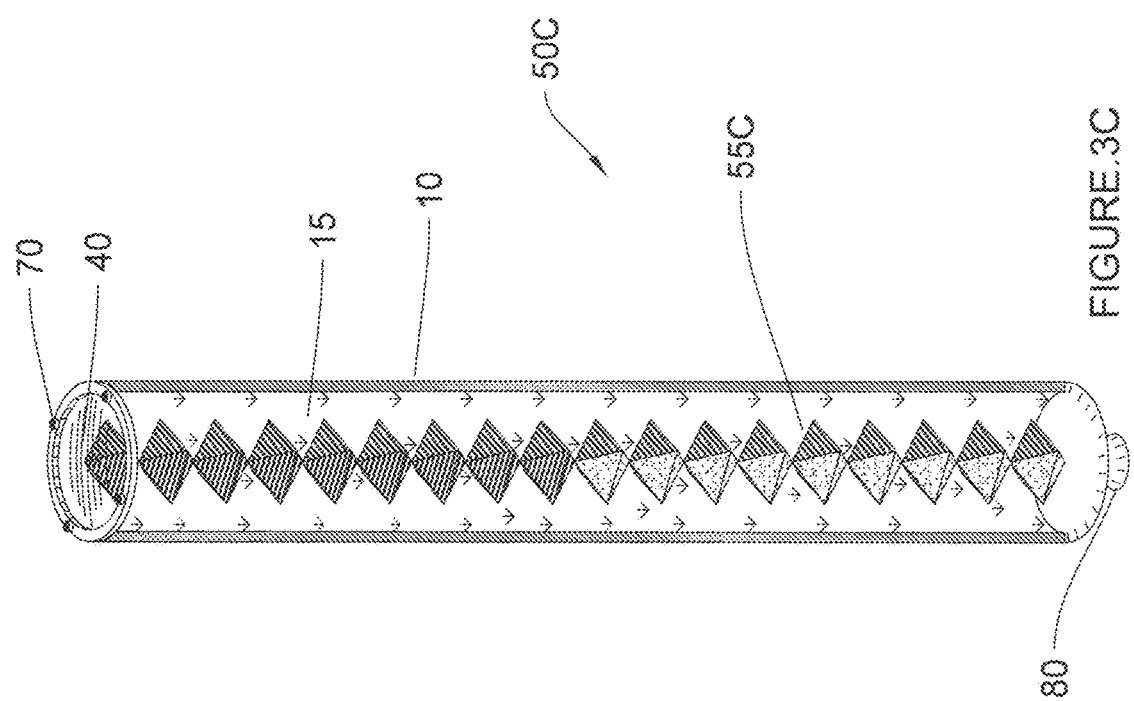

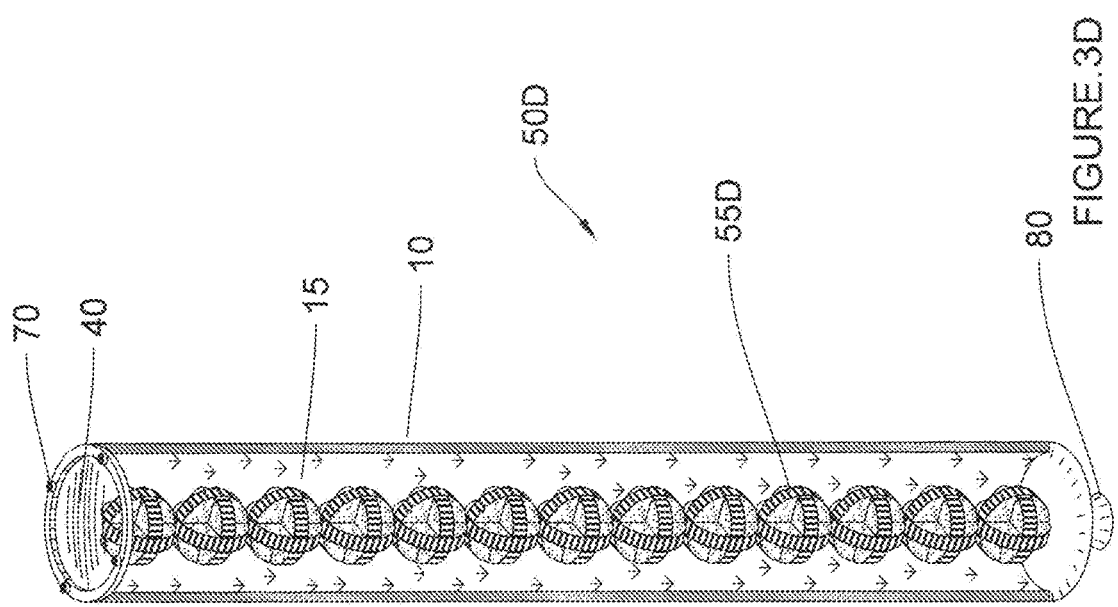

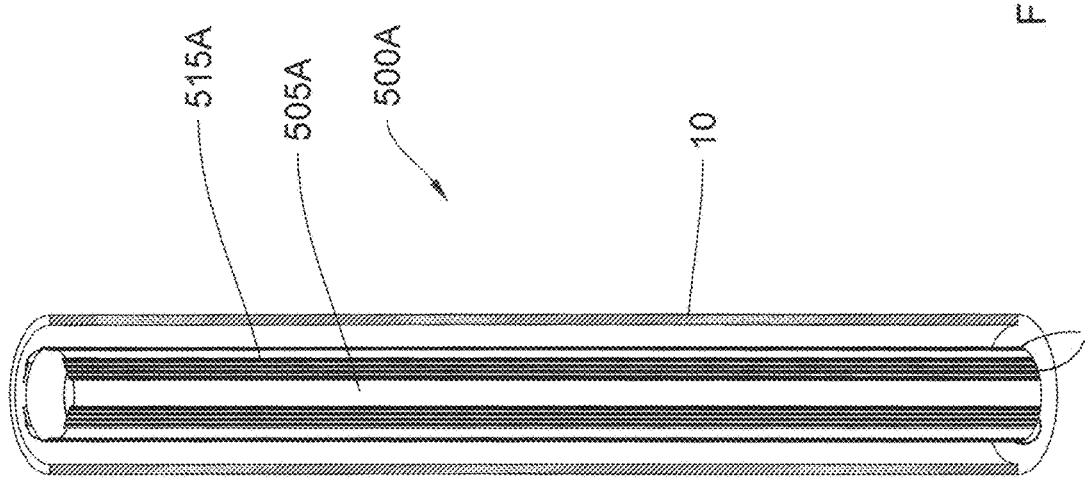

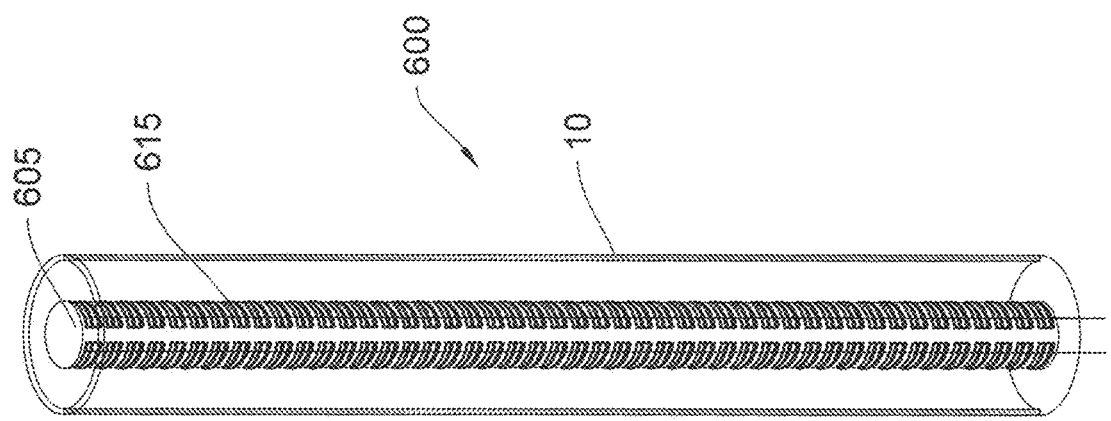

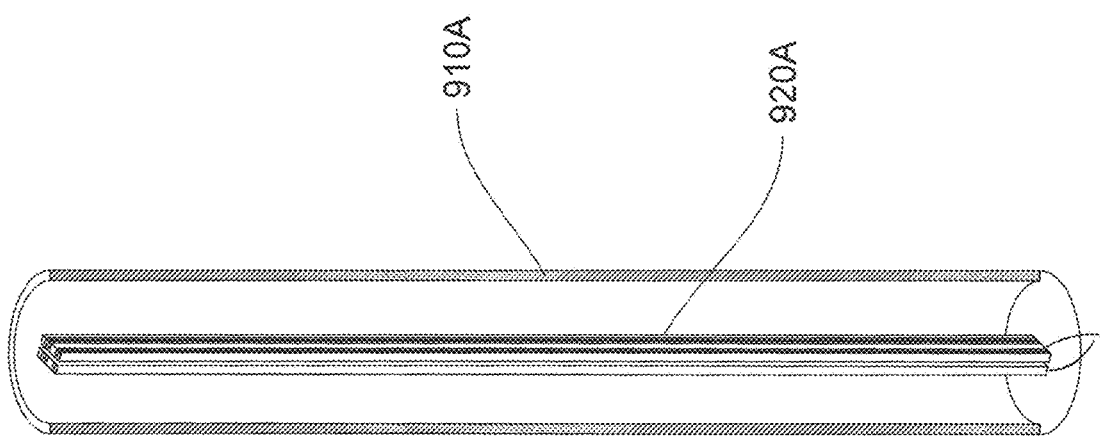

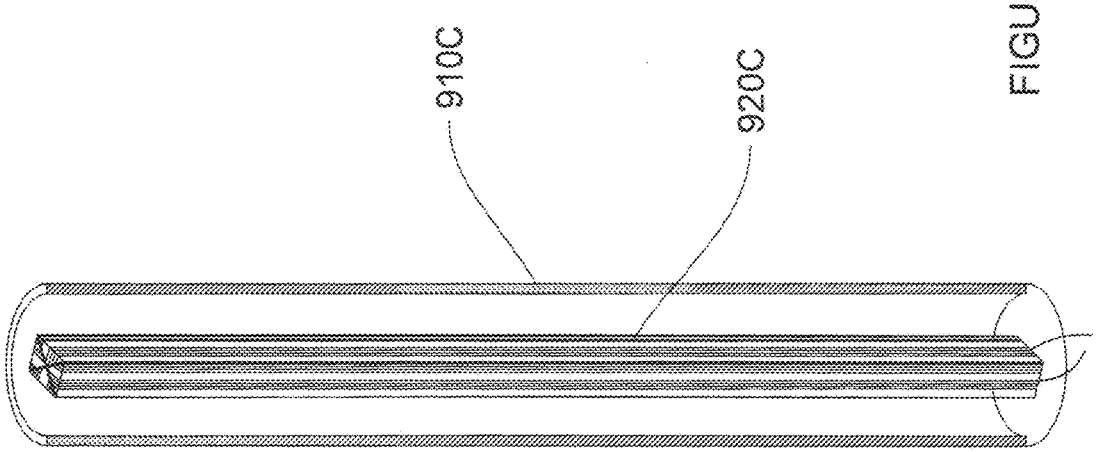

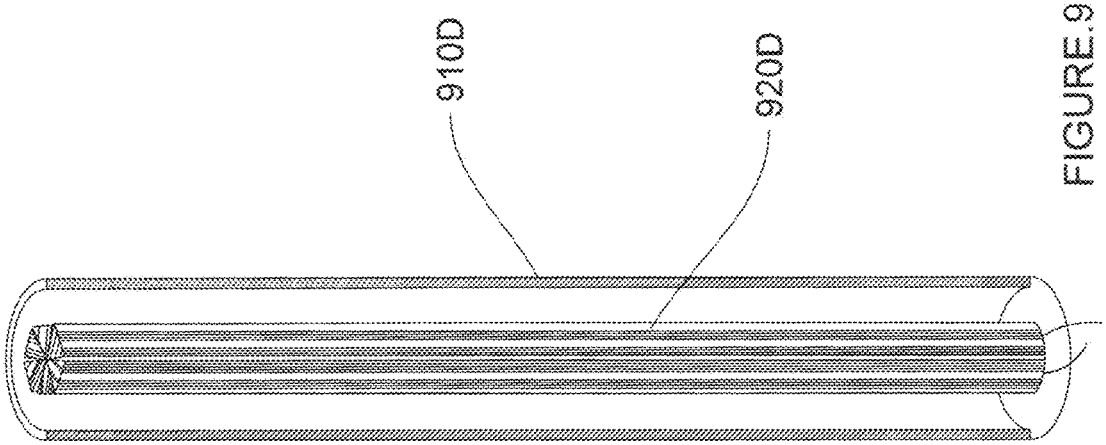

PHOTOVOLTAIC SYSTEMS WITH INTERMITTENT AND CONTINUOUS RECYCLING OF LIGHT

CROSS-REFERENCE TO RELATED APPLICATIONS

This application is a continuation-in-part of and claims priority to U.S. Ser. No. 15/069,591 filed on Mar. 14, 2016, which is a continuation-in-part of U.S. Ser. No. 14/506,232 filed Oct. 3, 2014, issued as U.S. Pat. No. 9,287,428, the contents of which are incorporated by reference herein, and which also claims benefit of provisional patent application No. 62/003,790 filed May 28, 2014 and provisional patent application No. 62/039,704 filed Aug. 20, 2014.

BACKGROUND

The present invention relates generally to the field of photovoltaic systems for conversion of solar energy into electrical energy using a method of recycling of light intermittently or continuously. Use of renewable energies is increasing because of the limited supply of coal, petroleum products and other hydrocarbons. Renewable energy sources are green and environmentally friendly. Among the renewable energies, solar energy is freely and abundantly available.

Various commonly used devices are operable with solar energy. For example, solar calculators are very common. In addition to solar energy, these calculators work under any source of light energy. Similarly wrist watches are also available that work under light energy of any kind. Solar and other light energies are useful for several applications, from powering space stations to many household appliances.

Photovoltaic systems use solar radiation—both direct and scattered sunlight—to create electrical energy. The basic building blocks of a photovoltaic system are solar/photovoltaic cells. The cells typically consist of semiconductor materials that convert light into electricity. In order to increase power output, a plurality of cells can be interconnected to form panels or modules. The panels are typically flat. Several modules can be installed in a rack to form a photovoltaic array. Photovoltaic systems further include mounting racks and hardware for the panels, wiring for electrical connections, and power conditioning equipment, including inverters and optional batteries for electricity storage.

The energy conversion efficiency or ECE ($\eta$) of the cells is the percentage of the incident photon energy in the form of sunlight or any other source of light that is converted to electrical energy. When a photon penetrates a photovoltaic cell, it can produce an electron-hole pair. The pair generated may contribute to the current produced by the cell or may recombine with no net contribution to cell current.

SUMMARY

The one or more embodiments of the present invention propose a novel photovoltaic system. The system can include a housing with or without a top cover and a vertically arranged solar panel assembly within the housing. The solar panel assembly may include one or more reflective tubes. The tubes may or may not be provided with lids. Solar panels of various geometries may be arranged within the tube. The solar panels may be arranged vertically, horizontally or in combinations thereof. Light is recycled within the housing and/or within the tubes either continuously or intermittently. This will reduce the loss from the reflections outside the housing and will also improve the working efficiency of the semi-conductors/solar cells by creating the multiple passes, continuously or intermittently. The tubes may be arranged like towers inside the housing or the tubes may be bored into the housing with an appearance similar to a honey comb.

BRIEF DESCRIPTION OF THE DRAWINGS

The features and advantages of certain embodiments will be more readily appreciated when considered in conjunction with the accompanying figures. The figures are not to be construed as limiting any of the preferred embodiments.

FIG. 2A-2B illustrate a top and cross-sectional view of a top cover plate according to an embodiment of the invention.

FIGS. 3A-3D illustrate a longitudinal-sectional view of solar panel assemblies according to an embodiment of the invention.

FIGS. 5A-5B illustrate longitudinal-sectional view of a solar panel assembly according to an embodiment.

FIGS. 6A-6B illustrate a longitudinal-sectional view of a solar panel assembly according to an embodiment.

FIGS. 9A-9D illustrate longitudinal-sectional views of the cutouts having solar panels according to an embodiment.

DETAILED DESCRIPTION OF THE INVENTION

The following description presents several preferred embodiments of the present invention in sufficient detail such that those skilled in the art can make and use the invention. As used herein, the words "comprise," "have," "include," and all grammatical variations thereof are each intended to have an open, non-limiting meaning that does not exclude additional elements or steps. As used herein, a "fluid" can be a liquid or gas. For example, the fluid may be water, air, or gas.

Our ability to harvest solar energy continues to be inefficient. The amount of power generated by a photovoltaic (PV) system can depend on: (a) the amount of the sunlight that reaches the system, and (b) how the available light is utilized. Most solar panels cannot capture and utilize optimal light for various reasons. For solar applications, this limitation reduces the utility of the PV system significantly especially in non-tropical regions of the world. The area required for the PV system to generate even modest amount of energy is very large and this limits its utility. Furthermore, conventional present solar panels are continuously bombarded by the solar radiation. It is further hypothesized that the solar cells may function sub-optimally when they are constantly stimulated without intervening rest periods. In a typical solar panel there is about 50-80% of the total light reflected back into the atmosphere from the outer surface of the panel. The infrared and ultraviolet rays are wasted by producing undesirable heat when the intended use is to produce electricity. Another portion of the light passes through the panel without doing anything. All these wasted elements amount to over 80% of the available light. In addition, there is inherent system inefficiency, due to the single pass of light through the semi-conductor, reducing its total energy conversion rate to about 17 to 18% efficiency. Yet another serious problem with the present solar panels may be the factor of continuous stimulation paralyzing the solar cells and reducing its efficiency. Preliminary testing by the inventor has shown that continuous stimulation can reduce power output over time by around 30%-40%. The benefit of intermittent stimulation is an area not considered so far and has the potential to make significant contribution to the harvesting of solar energy. Considerable research and development has been devoted to improving the various parts of a photovoltaic system to improve generation of electricity. Much of the research has been focused on improvements in solar cells and in improving the energy conversion efficiency of solar cells. Research has also been focused on concentrators in which light is focused by lenses or mirrors onto an array of solar cells. While the demand for solar and photovoltaic technology continues to grow worldwide, widespread use is inhibited by associated costs.

Figure 1A:
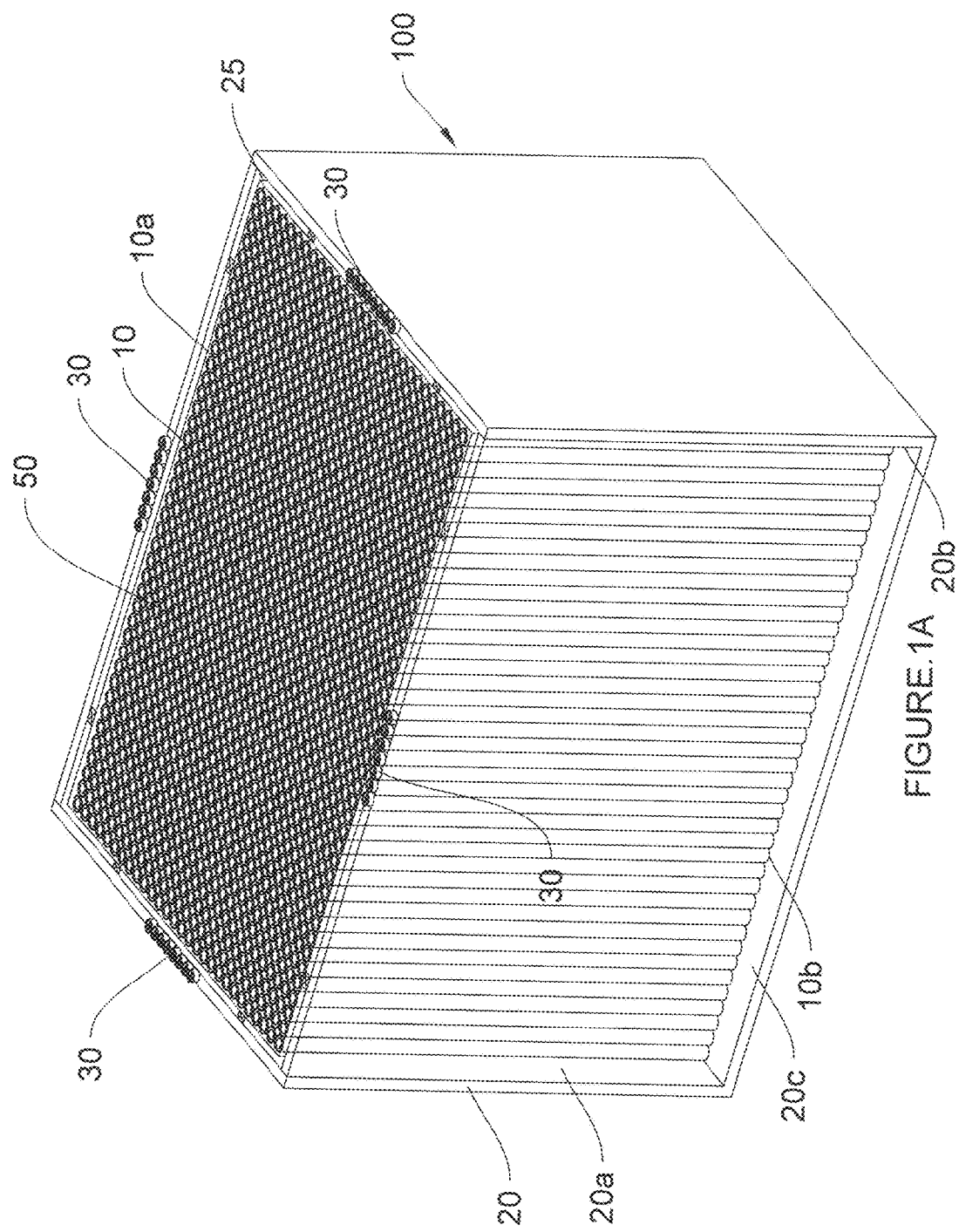
FIGS. 1A-1B illustrate a perspective view of a photovoltaic (PV) system according to an embodiment of the invention.
Figure 1B:
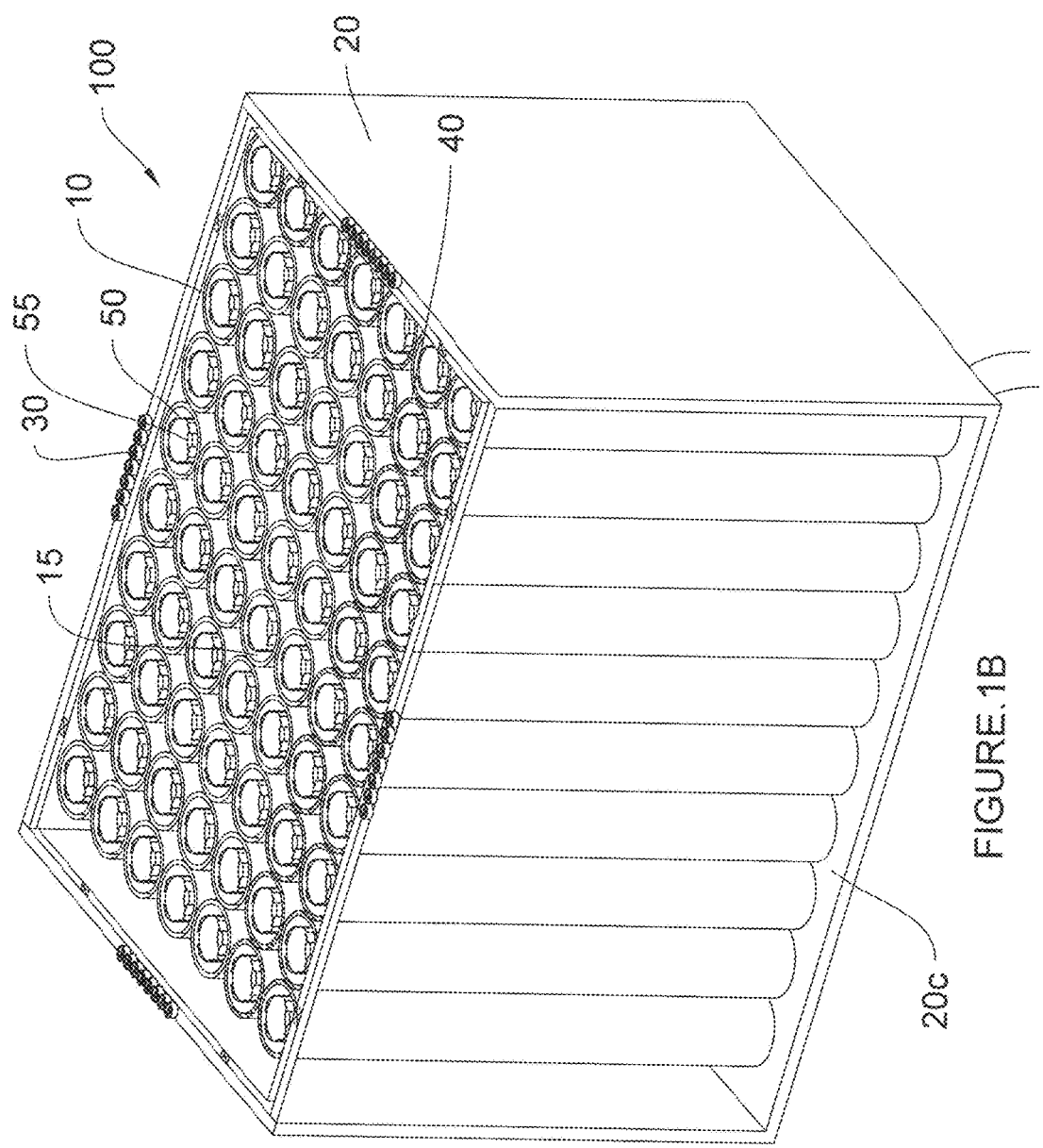

FIGS. 1A and 1B illustrate an embodiment of the photovoltaic (PV) system 100. The PV system 100 includes a solar panel assembly 50 positioned within a substantially cubical housing 20. The solar panel assembly 50 comprises an array of elongated tubes 10 arranged along the length and width of the housing 20. The tubes 10 may be stacked vertically or in an upright position within housing 20. In one or more embodiments, solar panels (not shown) may line along the sidewalls 20a, 20b of the housing 20. The tubes 10 may be arranged vertically or in a tower- or pillar-like arrangement within the housing 20. The tubes 10 may be tightly packed such that there is substantially no spacing between each of the tubes 10. The inside surface of one or more sidewalls 20a, 20b and the base 20c of the housing 20 may comprise a transparent insulating material. The inside surfaces of sidewalls 20a, 20b may be a reflecting material or solar cells to increase the incident photon energy on the tubes 10. Suitable light sensors or photocells 30 may be positioned along one or more sides of a top surface of the housing 20, to direct the housing 20 towards the source of light at any time around a 360 degree. The tubes 10 may be substantially cylindrical or oval and may have a hollow tubular cross section. Each of the tubes 10 may be lined inside and/or outside with a reflective material. A first end 10a of each of the tubes 10 may be provided with a lid 40. The second end 10b of each of the tubes 10 may be affixed to an inside surface of the base 20c of the housing 20. The length of the tubes 10 may be greater than their diameters. The length and diameter of the tubes 10 may be variable. In one or more embodiments, the tubes 10 may be carbon nanotubes, aluminum, fiber glass, etc. Carbon nanotubes may be stronger than steel while having only a fraction of its weight. The tubes 10 are configured to facilitate total internal reflection from the inside surfaces and also from a deep end of each tube.

The tubes 10 include a hollowed core. A channel 15 extends through the length of each of the tubes 10. Each of the tubes 10 comprises one or more solar panels 55. The solar panels 55 may be positioned within the channel 15 and they may be arranged perpendicular to base 20c. In one or more embodiments, the solar panels 55 may not extend to the top of the tubes 10.

The housing 20 is configured to support the solar panel assembly 50. The housing 20 may include a transparent top cover plate or sheet 25. The cover plate 25 substantially covers the entire top surface of the housing 20. The cover plate 25 may be made of a thin sheet of a transparent material like polycarbonate, polyvinyl fluoride, glass or the like so that it allows substantially all incident sunlight to reach the solar cell assembly. The undersurface of the cover plate 25 is designed for the light from inside the housing 20 to reflect back onto the solar cell assembly within the tubes 10. By selecting different types of the various one-way reflecting systems known in the art, a desirable balance may be achieved between the light passing through into and the light reflected back into the housing 20.

Figure 1C:
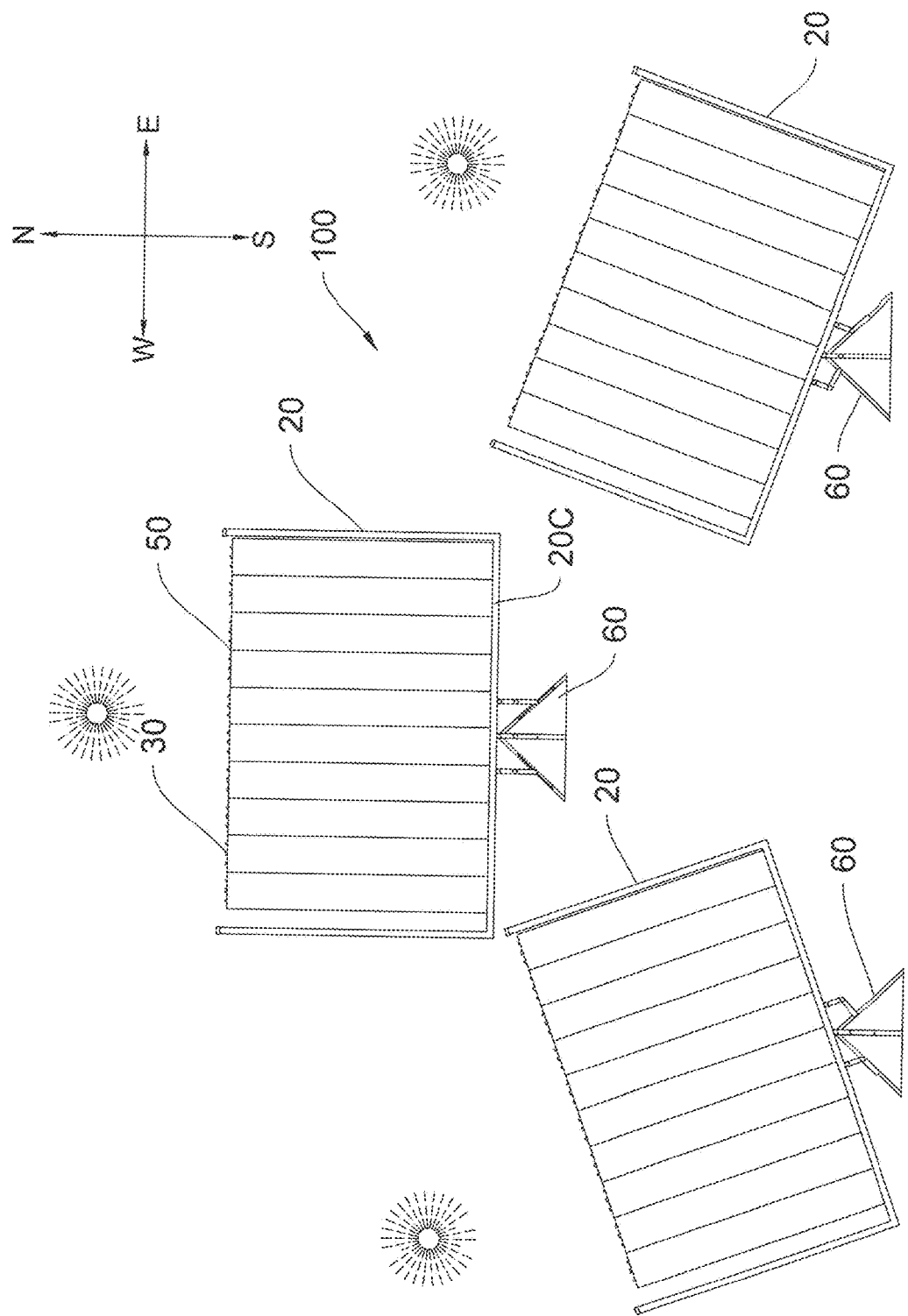
FIG. 1C illustrates a PV system with a pivot according to an embodiment of the invention.
Figure 3B:
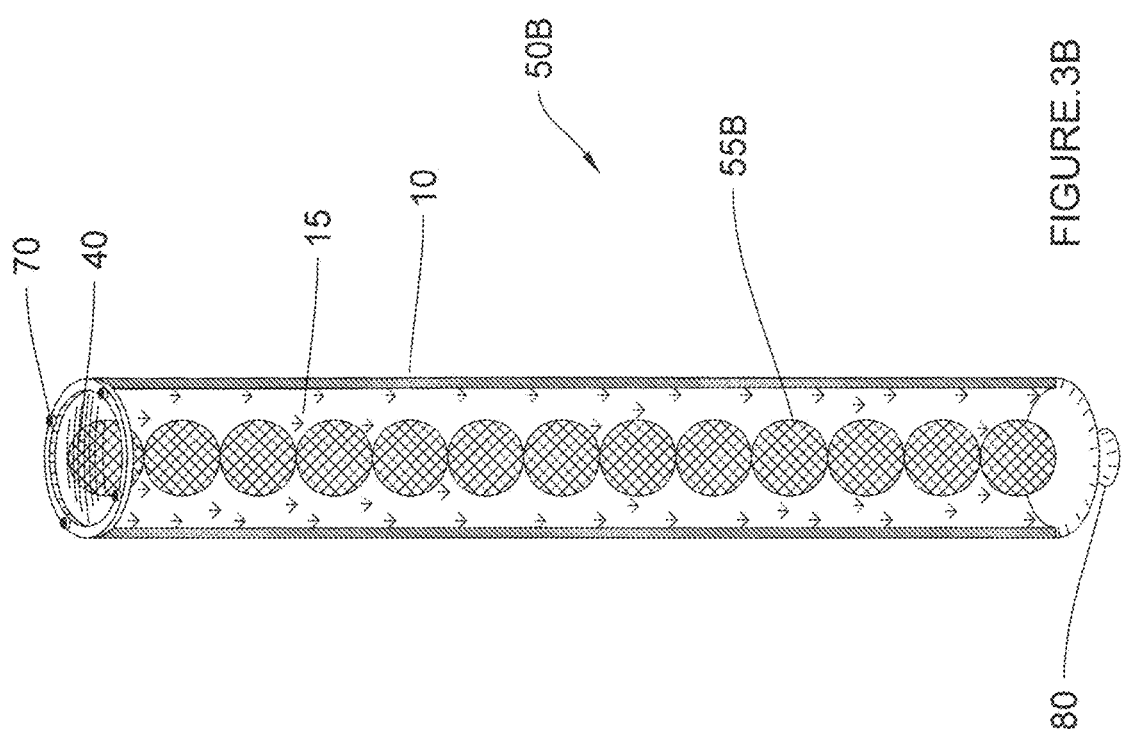

The PV system 100 having a solar panel assembly 50 is illustrated in FIG. 1C. As shown, the housing 20 may be provided with a pivot 60. The base 20c of the housing 20 rests on the pivot. Light sensors 30 detect incident sunlight. The light sensor 30 are in operable communication with pivot 60. The pivot 60 may be configured to tilt the housing 20 in the direction of incident sunlight (or any source of light) based on detected sunlight. This ensures that the solar panel assembly 50 faces the sun over a 360 degree circle.

As shown in FIGS. 2A-2B, the cover plate 25 can be configured with a plurality of filters and coatings 35. For example, the cover plate 25 may have infrared (IR) and ultraviolet (UV) filters. The cover plate 25 can also have a coating on its undersurface (that is the side not exposed to sunlight) 25A in order to prevent incident photon energy/light from escaping out. The cover plate 25 may also include an augmenting layer. The augmenting layer may involve the use of laser principles. The cover plate 25 may further include an electrochromic layer. The electrochromic layer may involve the incorporation of electrochromic coating (or suitable devices—not shown) into the undersurface of the cover plate 25A in order to automatically control the amount of light passing through it. For instance, the electrochromic coating can be configured to allow light to pass through the cover plate 25 intermittently. Electrochromic coatings are known in the art.

Embodiments of the solar panel assembly 50A-50D are depicted in FIGS. 3A-3D. The solar panel assembly 50A-50D comprises a reflective tube 10 having a vertical channel 15 and a lid 40. The lid 40 comprises a suitable transparent insulating material including, but not limited to, glass or a suitable material that allows the transmission of light. An ultraviolet (UV) or infrared (IR) filter or coating may be further incorporated into the lid 40. Such a filter or coating may advantageously filter out undesirable UV/IR light bands while allowing optimal bands of light to penetrate into the tubes 10, thereby reducing the generation of heat. Such an arrangement creates a light trap by forcing light to stay within the tubes 10. The lid 40 may include an electrochromic layer and an augmentation layer. Light sensors 70 may be positioned over the lid 40. As shown, the tubes 10 may be provided with a pivot 80 at the base. The pivot 80 may be substantially conical and may be configured to support the solar panel assembly 50A-50D. The pivot 80 may be configured to tilt the tube 10 in the direction of incident sunlight. This ensures that the solar panel assembly 50A-50D faces the sun over a 360 degree circle.

One or more solar panels 55A-55D may be vertically arranged within the channel 15. Each solar panel 55A-55D may include one or more solar cells (not shown) known in the art. The solar panels 55A-55D having the solar cells are arranged in depth and not in layers. Thus, the solar panels 55A-55D have a three-dimensional arrangement within the tubes 10. The solar panels 55A-55D can have different geometries.

Solar panel 55A has an elongated "cross-shaped" geometry. Solar panel 55A can include photovoltaic cells on all external surfaces. Alternately, each of the external surface on solar panel 55A may include a combination of photovoltaic devices or solar cells and mirror-like reflective surfaces. The mirror-like reflective surfaces may include high quality mirrors for reflecting incident light. The surfaces can be flat, rectangular, curved or a combination of these surfaces. Solar panel 55B includes a plurality of abutting globes or spheres stacked above each other to form a columnar spherical arrangement. The external surfaces of the spheres may also have photovoltaic cells or a combination of photovoltaic cells and reflective surfaces. Solar panel 55C includes a plurality of abutting pyramidal structures stacked above each other to form an elongated column. The pyramidal structures may have triangular faces that have photovoltaic cells or mirror-like reflective surfaces. Solar panel 55D includes a plurality of globes having wedge cuts stacked above each other to form a columnar arrangement. The globes may have either flat or curved boundaries that form the surface for a high quality mirror for reflecting light. Photovoltaic cells may be attached to peripheral surfaces along the diameter.

The purpose of these various shapes is to optimize light absorption even when the sunlight is not hitting the solar panel assembly 50A-50D straight down and is instead coming down from different angles. A person skilled in the art can understand that other embodiments with other such variations in panel geometries and their combinations are possible and are within the scope of this disclosure for the intended purpose. It is understood that the various geometries disclosed herein are intended to be non-limiting and the panels can include any suitable planar or non-planar geometry.

The arrangement of panels 55A-55D having non-planar shapes inside the tube 10 facilitates multiple reflections of the light rays inside the tube 10. Accordingly, the energy conversion efficiency (ECE) of the photon energy to electrical energy by the solar panel assembly 50A-50D can be substantially enhanced over comparable prior art systems.

Figure 4A:
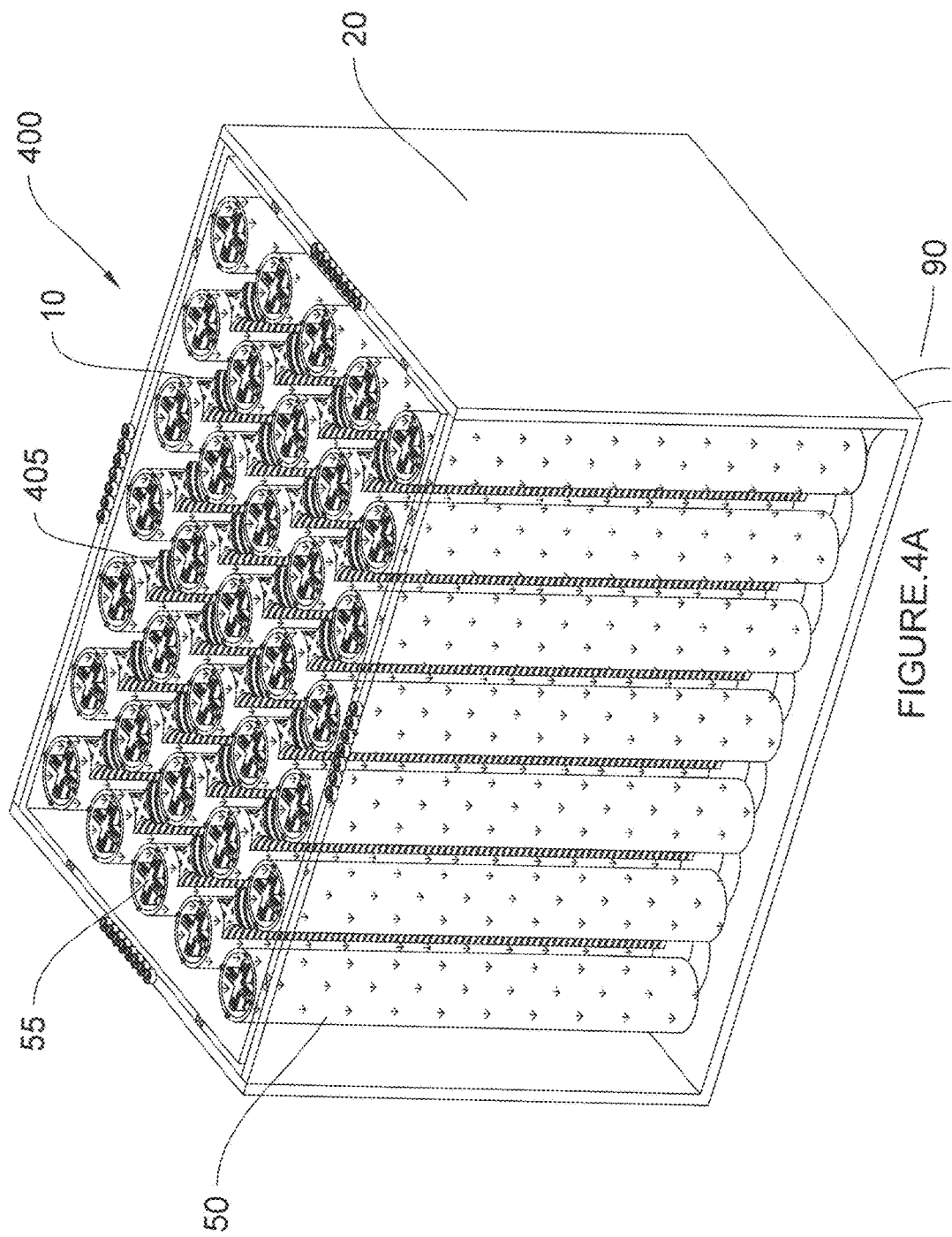
FIGS. 4A-4C illustrate another embodiment of the PV system with solar panels positioned in the gaps between the tubes.
Figure 4B:
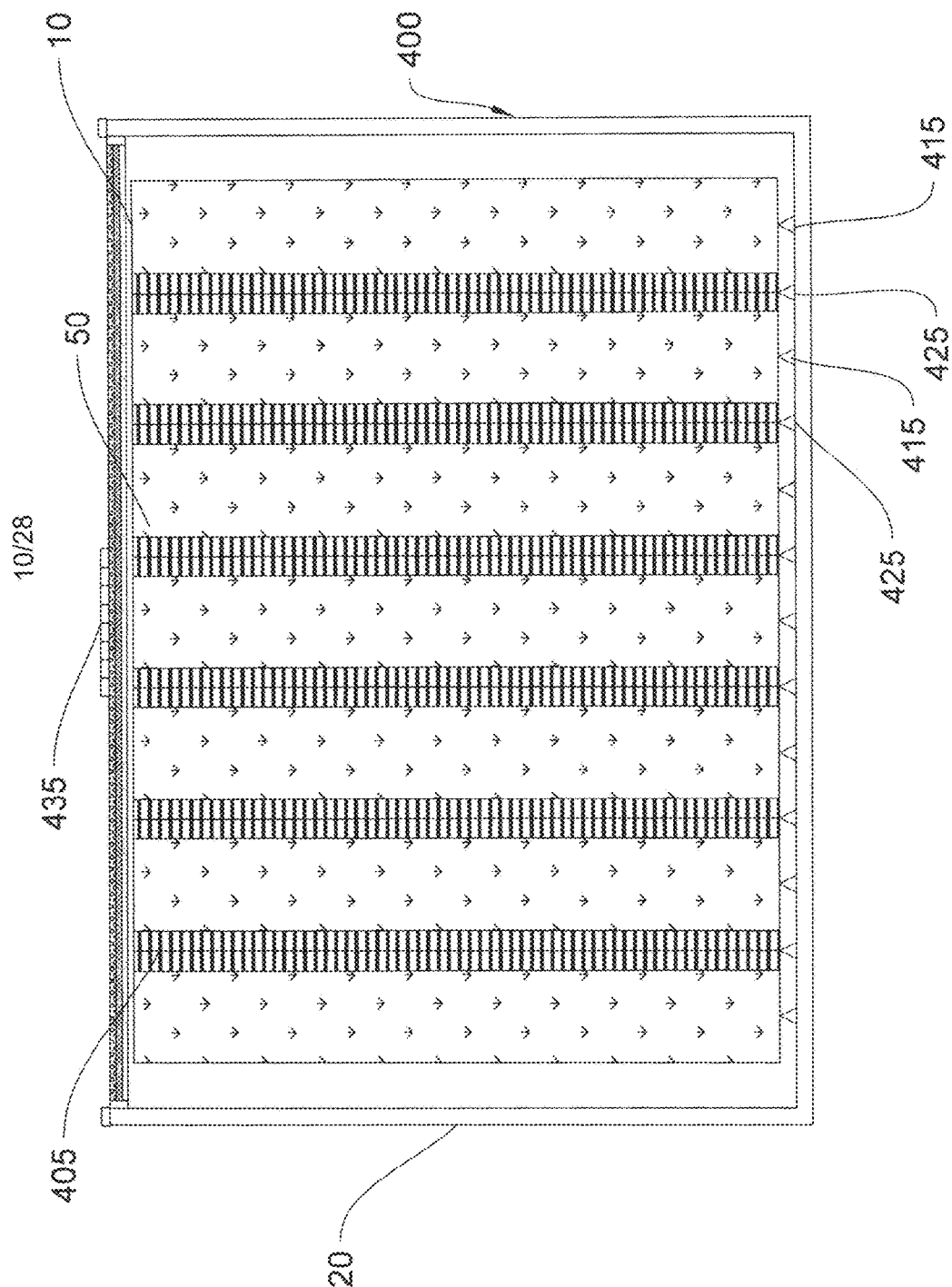
Figure 4C:
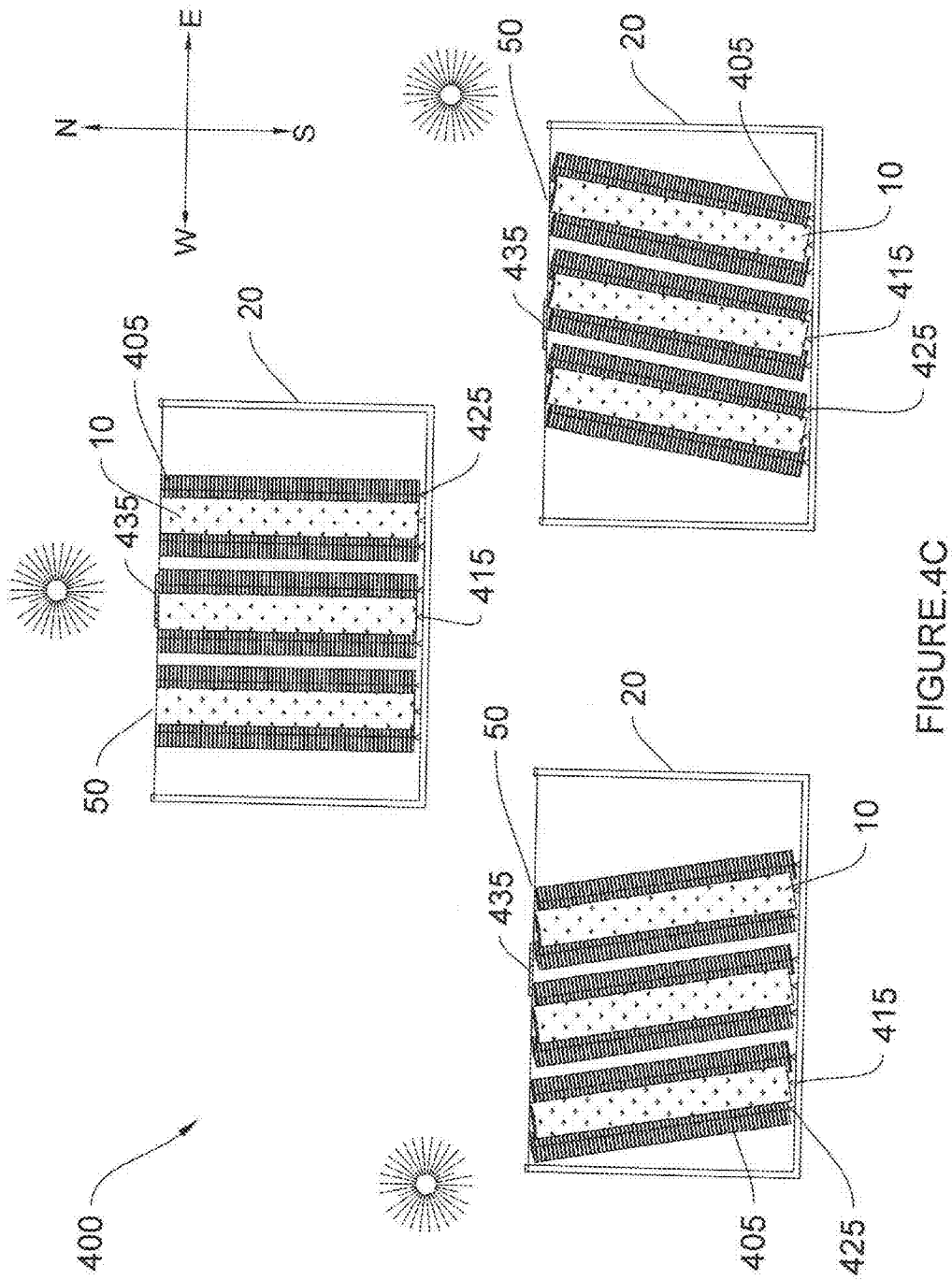

FIG. 4A-4C illustrate another embodiment of the PV system 400. The PV system 400 includes housing 20 for solar panel assembly 50. The solar panel assembly 50 may include a plurality of tubes 10. The tubes 10 may be arranged vertically or in a tower- or pillar-like arrangement within the housing 20. The tubes 10 can be connected either in series or in parallel or a combination of the two. For example, if there are one hundred towers, they may be all connected serially or in parallel or ten towers may be connected serially to form ten groups of ten towers, which may be connected parallel and various combinations of the same. Each tube 10 includes a solar panel 55 having solar cells (not shown). Although the solar panels 55 are shown having a cross-shaped geometry, it is understood that they can have any geometry, including a spherical, pyramidal or globular geometry (as described in FIGS. 3B-3D). Each of the tubes 10 may be separated from an adjacent tube 10 by a predetermined spacing. Elongate solar panels 405 can be positioned in the space or gap between adjacent tubes 10. The solar panels 405 are stacked vertically and aligned in parallel to the tubes 10. The solar panels 405 may be configured to have four arcuate faces. Each arcuate face may be configured with photovoltaic devices or a combination of photovoltaic devices and reflective mirrors to ensure optimal electricity production. The outside surfaces of tubes 10 may also be lined with reflective material in order to optimize energy output from the panels 405.

As shown in FIG. 4B, the tubes 10 and each of the solar panels 405 may be provided with a pivot 425. The housing 20 may be provided with a pivot 415 (similar to 80) and with light sensors 435. As shown in FIG. 4C, when the light sensors 435 detect sunlight, they cause the pivots 415, 425 to tilt the housing and/or the tubes 10 and solar panels 405 in the direction of the sunlight.

Figure 10:
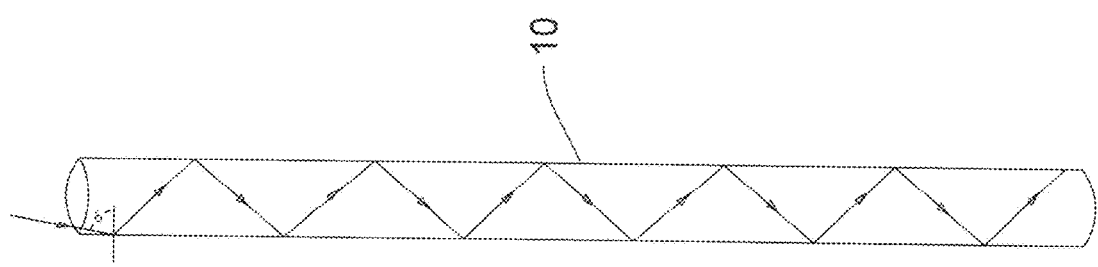
FIG. 10 illustrates total internal reflection in the solar panel assembly according to an embodiment.

As can be seen in FIGS. 3A-4C, the tubes 10 are aligned such that sunlight (or light from any other source) can enter from the top of the tube. The arrows depict the path of the light within the tubes 10. As shown in FIG. 10, when parallel rays enter tube 10, that is, when the angle of incidence is close to 90 degrees, there is a higher probability of total internal reflection within the tube. The inside surface of the tube 10 may be coated with a suitable totally reflecting material, such that the light is totally reflected back into the solar panels (not shown). Thus, light is forced to scatter back onto the panels inside the tube 10 thereby facilitating multiple passes of the incident light. This will also help a rather uniform distribution of light onto panels irrespective of the angle in which the light enters the tube 10. By tilting the tubes 10 (or the housing) directly towards the light source, the incidence of light is brought to the optimal angle, so that the system will benefit from the well-established principles and advantages of fiber optics. Thus, the embodiments of the invention optimize the harvesting of light by reducing the amount of wasted light due to refraction and reflection and by increasing the total internal reflection. The embodiments of the invention can also avoid the disadvantages, such as, reduced power output, caused by the continuous stimulation of solar panels. In one or more embodiments, in order to facilitate fiber optics, the height of each of the panels (55, 55A-55D) may be around 90% of the height of the tube 10 such that there is a 10% gap between a top surface of the panel and a top surface of the tube.

FIG. 5A illustrates an embodiment of solar panel assembly 500A. Solar panel assembly 500A includes a reflective tube 10 as described earlier. Positioned within tube 10 is a cylindrical core 505A that extends the length of the tube 10. As shown, the cylindrical core 505A may be hollow. However, in other embodiments, the cylindrical core 505A may be a solid shaft. A plurality of solar panels 515A may be arranged vertically along the length of the core 505A. As shown, tube 10 comprises six vertical solar panels 515A. The solar panels 515A may be connected in series, in parallel or in any combinations thereof. The surface of the cylindrical core 505A that is between the solar panels may include a reflective surface.

Figure 5B:
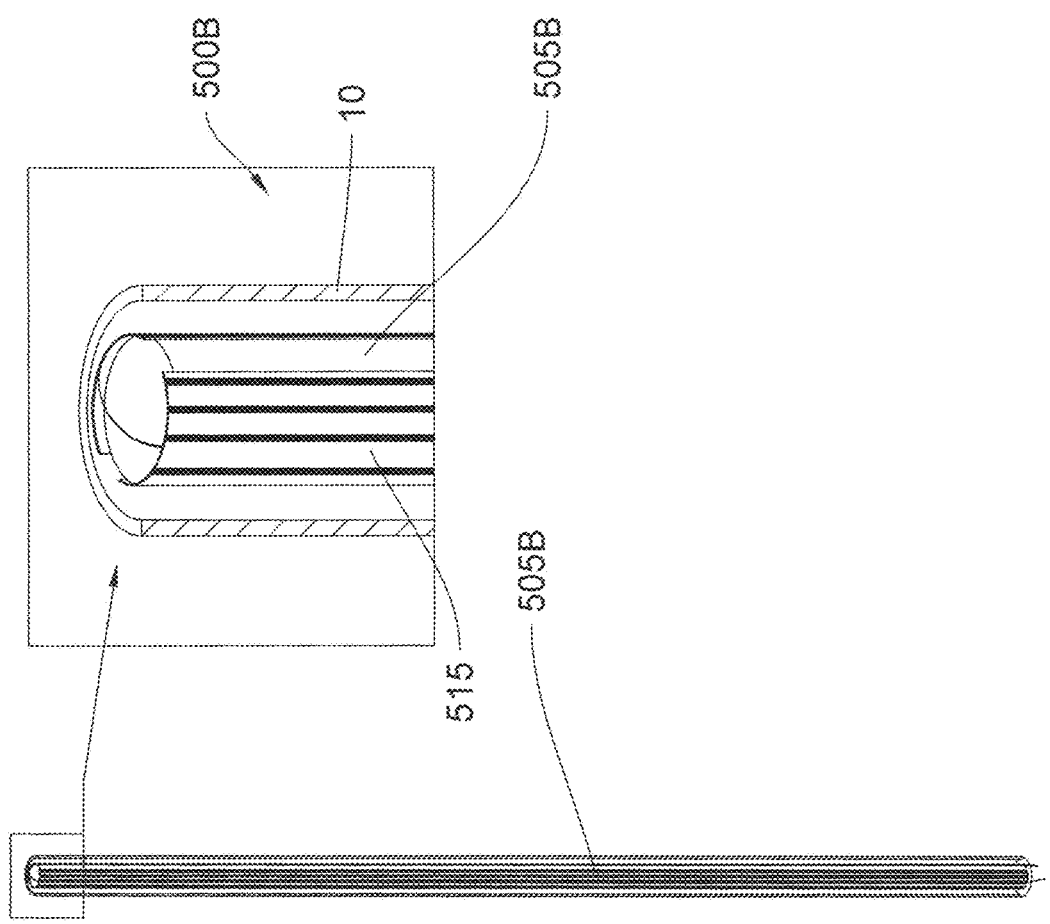

FIG. 5B illustrates an embodiment of solar panel assembly 500B. Solar panel assembly 500B includes a reflective tube 10. Positioned with tube 10 is a cylindrical core 505B that extends the length of the tube 10. As shown, tube 10 comprises two vertical solar panels 515B. Each solar panel 515B includes alternating photovoltaic cells and reflective surfaces. The surface of the cylindrical core 505A that is between the solar panels may include a reflective surface.

The space between the reflective tube 10 and the cylindrical cores 505A, 505B may be filled with transparent material like glass or plastic.

Figure 6B:
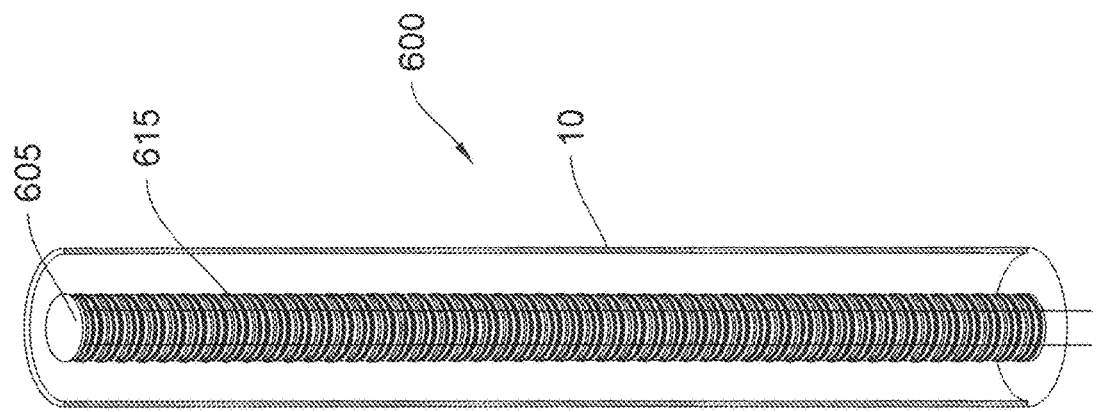

FIGS. 6A-6B illustrates an embodiment of solar panel assembly 600. Solar panel assembly 600 includes a reflective tube 10 as described earlier. Positioned within tube 10 is a cylindrical core 605 that extends the length of the tube 10. The cylindrical core 605 may be hollow or solid. A plurality of solar panels 615 may be arranged along the circumference of the core 605 like rings. As can be seen with reference to FIGS. 6A-6B, the solar panels 615 are shaped like C-rings. The solar panels 615 may be connected in series, in parallel or in any combinations thereof. The surface of the cylindrical core 605 that is between the solar panels 615 may include a reflective surface. The space between the reflective tube 10 and the cylindrical core 605 may be filled with transparent material like glass or plastic. In another embodiment, a single string of solar cells may be used as a central core.

Figure 7A:
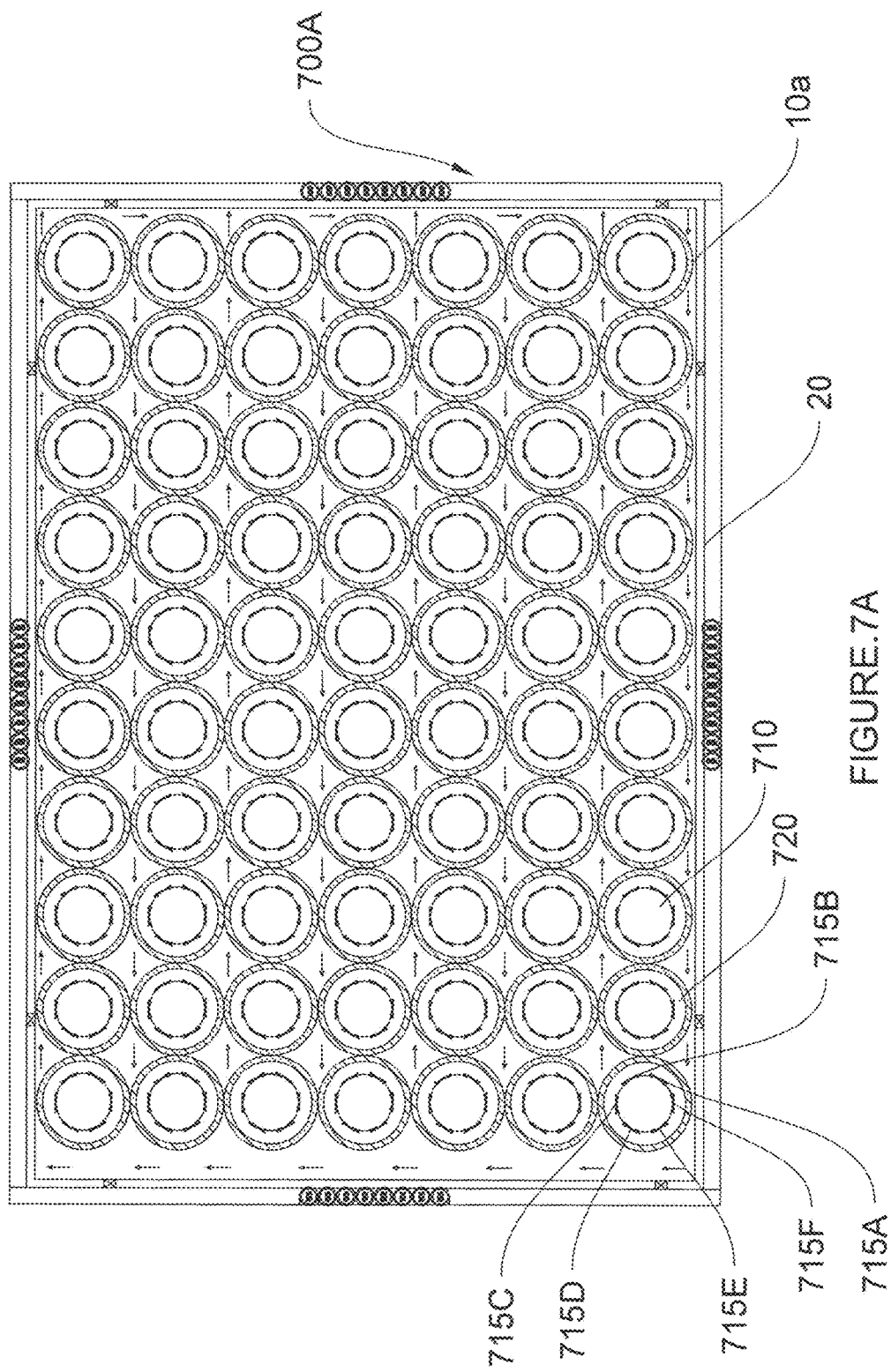
FIGS. 7A-7B illustrate a PV system with a cooling system according to another embodiment.

FIG. 7A shows the top view of an embodiment of the PV system 700A. As shown, cylindrical tubes 10A are arranged along the length and width of the housing 20. The tubes 10 may include a solid cylindrical shaft 710. Each cylindrical shaft 710 may be embedded with one or more solar panels. As shown, the cylindrical shaft 710 includes six solar panels 715A-715F. Air or liquid coolants can be circulated through the spaces between cylindrical tubes 10A (shown as arrows). The circular gap 720 between the tube 10A and shaft 710 acts as the medium for total internal reflection.

Figure 7B:
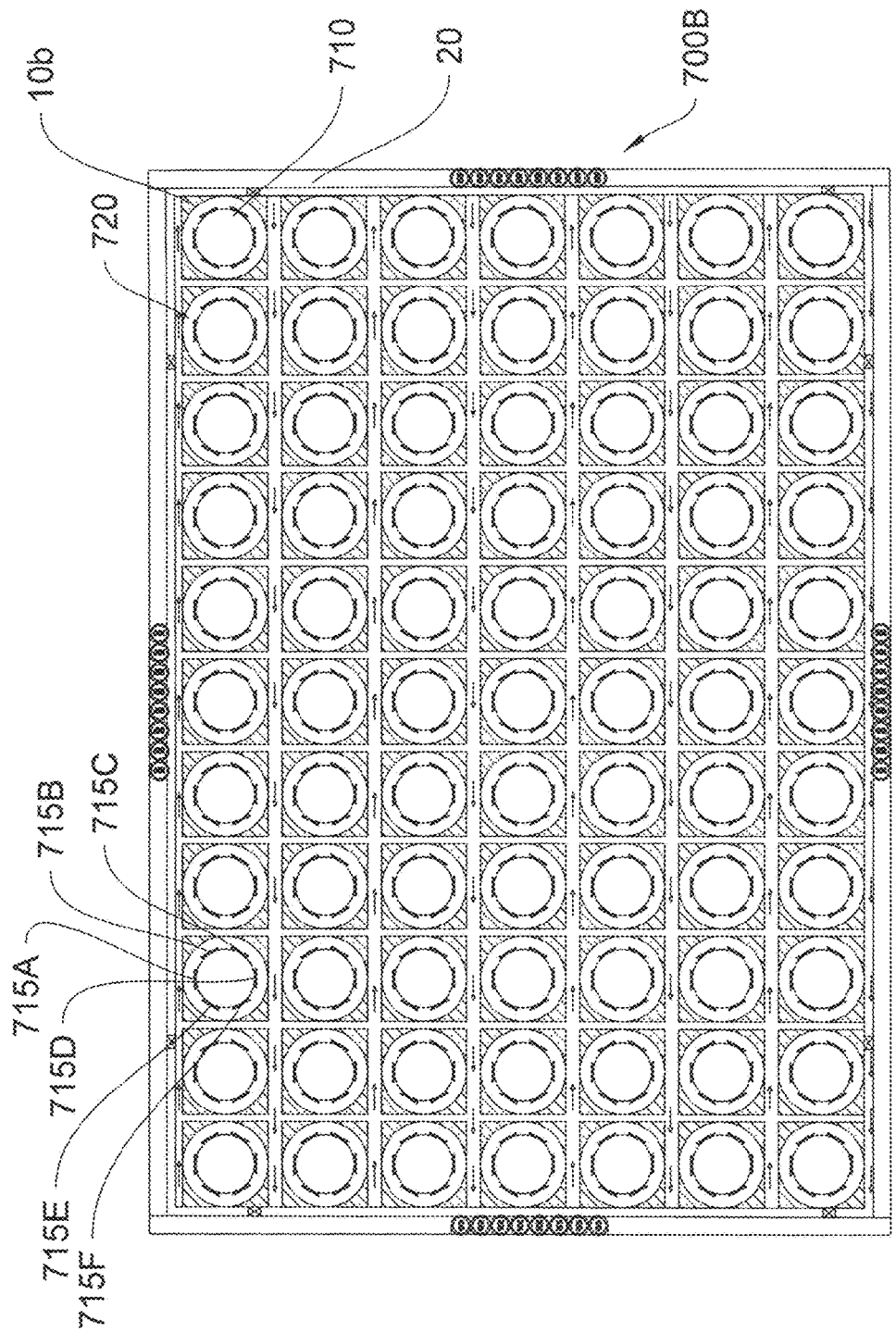

FIG. 7B is another embodiment of the PV system shown in FIG. 7A. As shown in FIG. 7B, the PV system 700B includes square-shaped towers 10B having circular/oval holes arranged along the length of the tower 20. Each square tower 10B is contained with a solid shaft 710 embedded with six vertical panels 715A-715F along its circumference. Air or liquid coolants can be circulated through the microtubules within the towers 10B or between the towers (shown as arrows). The circular gap 720 between the tube 10B and shaft 710 acts as the medium for total internal reflection.

Figure 8A:
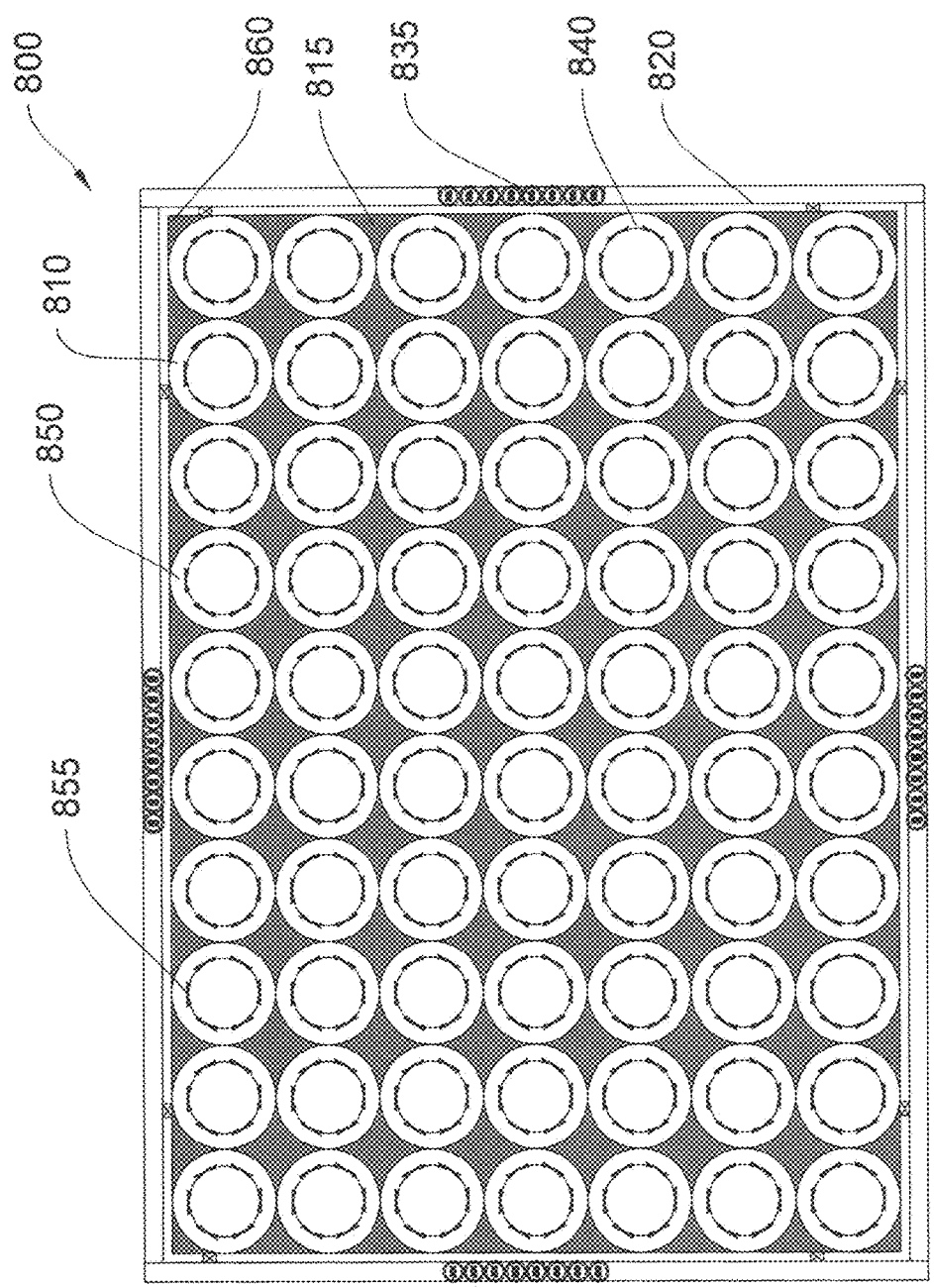
FIGS. 8A-8D illustrate a PV system having a solar panel assembly arranged in a honey comb pattern according to an embodiment.
Figure 8B:
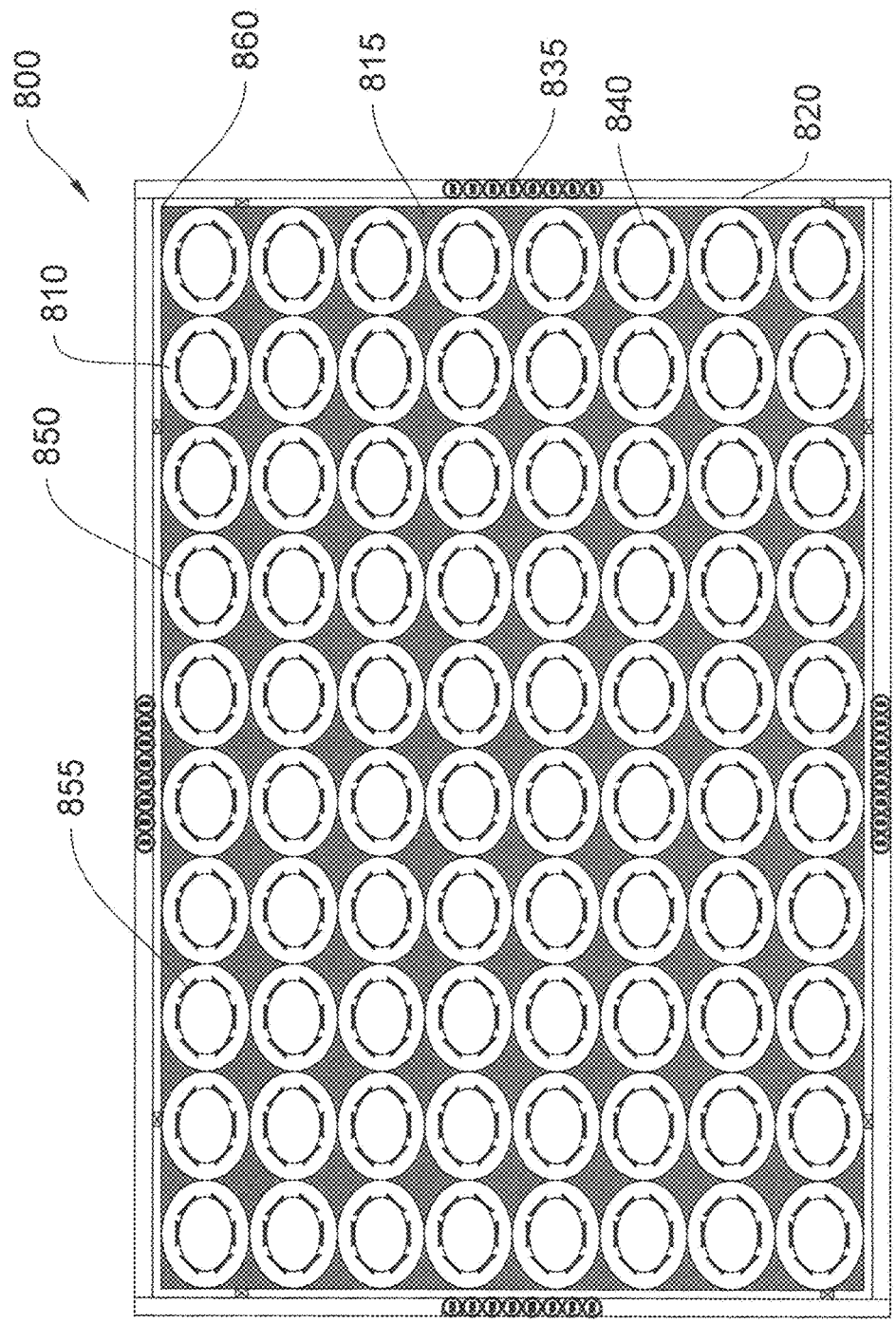
Figure 8C:
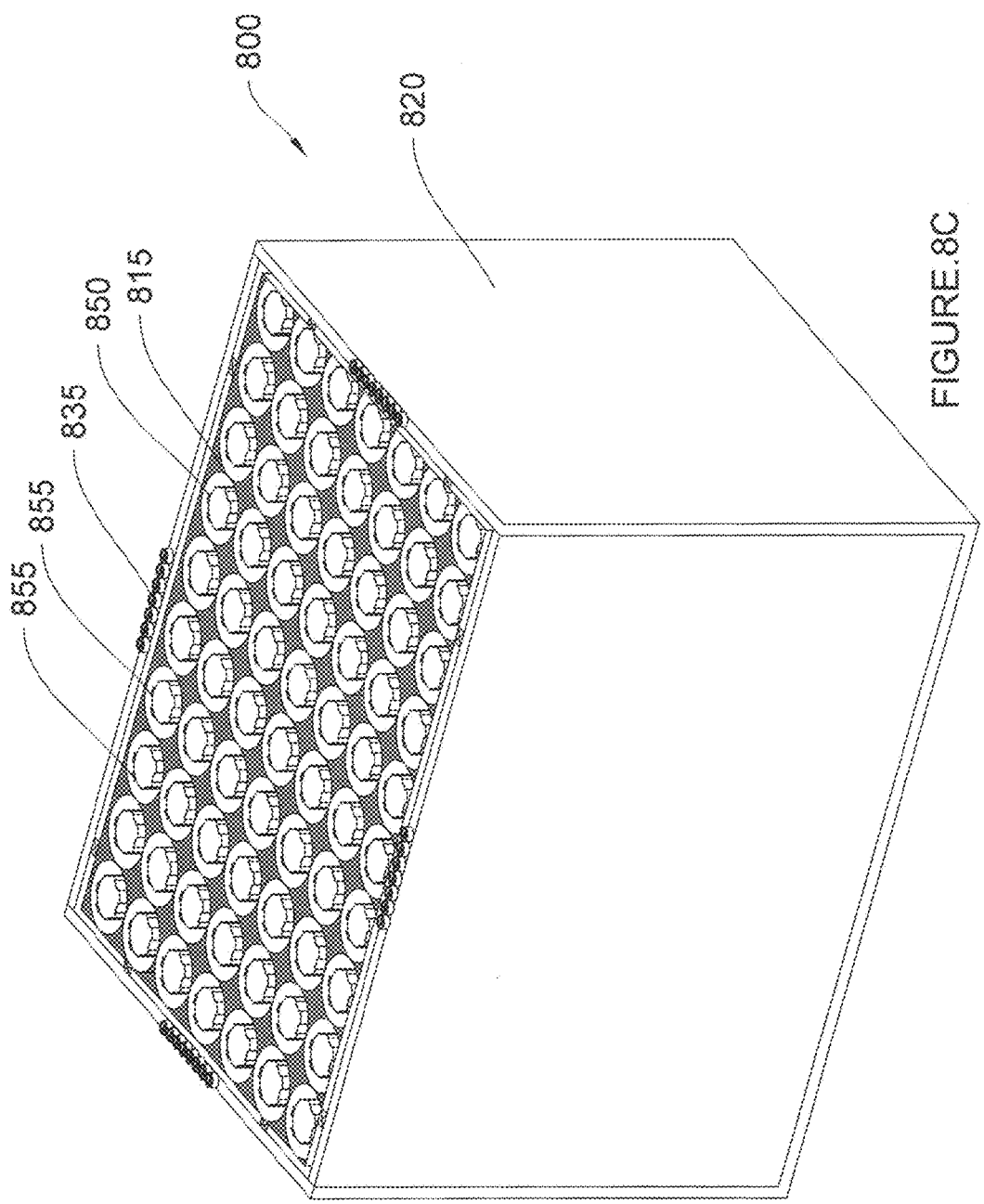
Figure 8D:
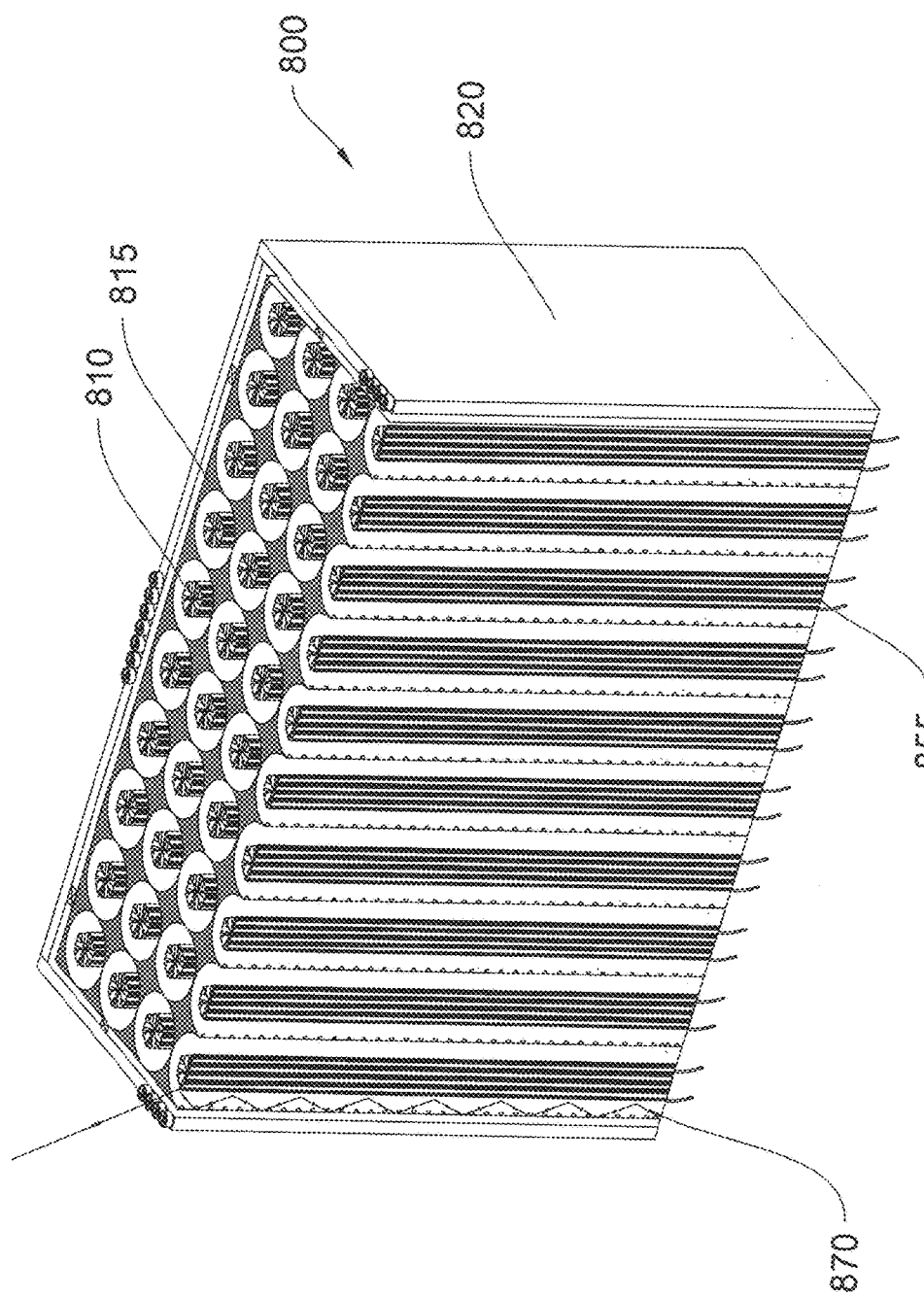

FIGS. 8A-8D illustrate another embodiment of the PV system 800. As shown, the PV system 800 comprises a solar panel assembly 850 arranged in a honey comb pattern. The PV system 800 comprises a housing 820. Light sensors 835 may be arranged along a top surface of the housing 820. The housing 820 comprises a box-shaped internal member 815. The member 815 may be made of any suitable material such as, aluminum or similar material. May also be made of coolant material. A top surface of the member 815 may be flush with a cover sheet 860 for the housing 820 while a bottom surface of the member 815 may be flush with the base of the housing 820. Tubular openings or cutouts 810 are formed within the member 815. The cutouts 810 extend from the top surface of the member 815 to the bottom surface of the member 815 creating an appearance of a honey comb. A solid shaft 840 may be placed directly within a cavity of each cutout 810 (as opposed to being positioned within a cylindrical tube, as shown in FIGS. 7A-7B). One or more vertical solar panels 855 may be embedded around the shaft 840. The solid region between the cylindrical cavities can either be made of coolant materials or can have fine tubules for air or liquid coolant (like sponge). The cutouts 810 can be of any shape. For example, the cutouts 810 can be circular (as shown in FIG. 8A) or they can be ovoid (as shown in FIG. 8B) or they can be a combination or circular or ovoid shapes. The working of total internal reflection 870 is shown in the sectioned shaft in FIG. 8D.

Figure 9B:
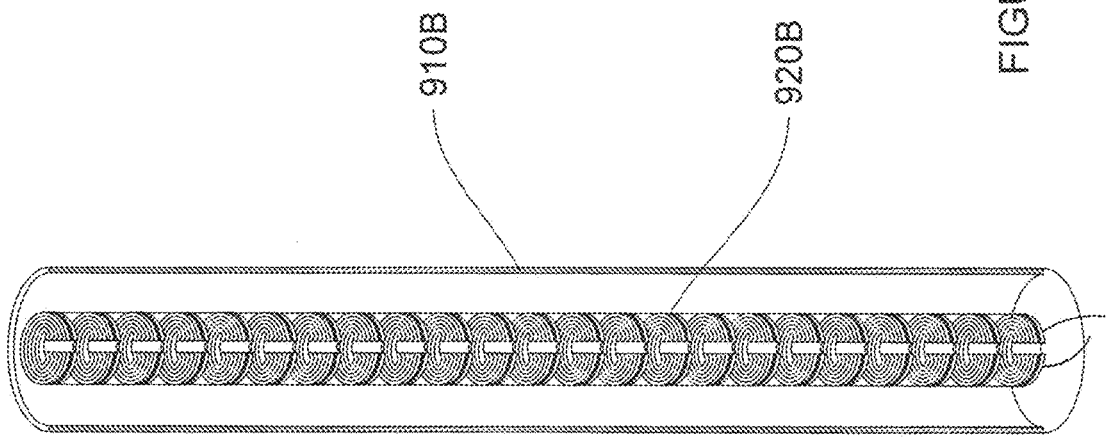

FIGS. 9A-9D illustrate longitudinal-sectional views of cutout solar panel assemblies 910A-910D. As shown, the shaft (840 shown on FIGS. 8A-8D) is substantially or completely non-existent. Therefore, the solar panels 920A-920D substantially contact an adjacent solar panel. In FIG. 9A, the two panels are opposed to each other, with no space in between. In FIG. 9B, the panels are like tokens with a slit, stacked one on top of the other. In FIG. 9C, the panels are arranged like in a four-sided structure with no gap in between. In FIG. 9D, the panels are arranged in a circle design with vertical panels without any space between them. An exemplary embodiment of FIG. 9D can also be a single strand of solar cells, or nano devices held in place by the transparent medium inside the tube 10 (not shown). FIGS. 9A-9D (and the single strand embodiment) depict minimizing the obstruction for the total internal reflection. Any other similar designs may be used to get the same result.

Figure 11:
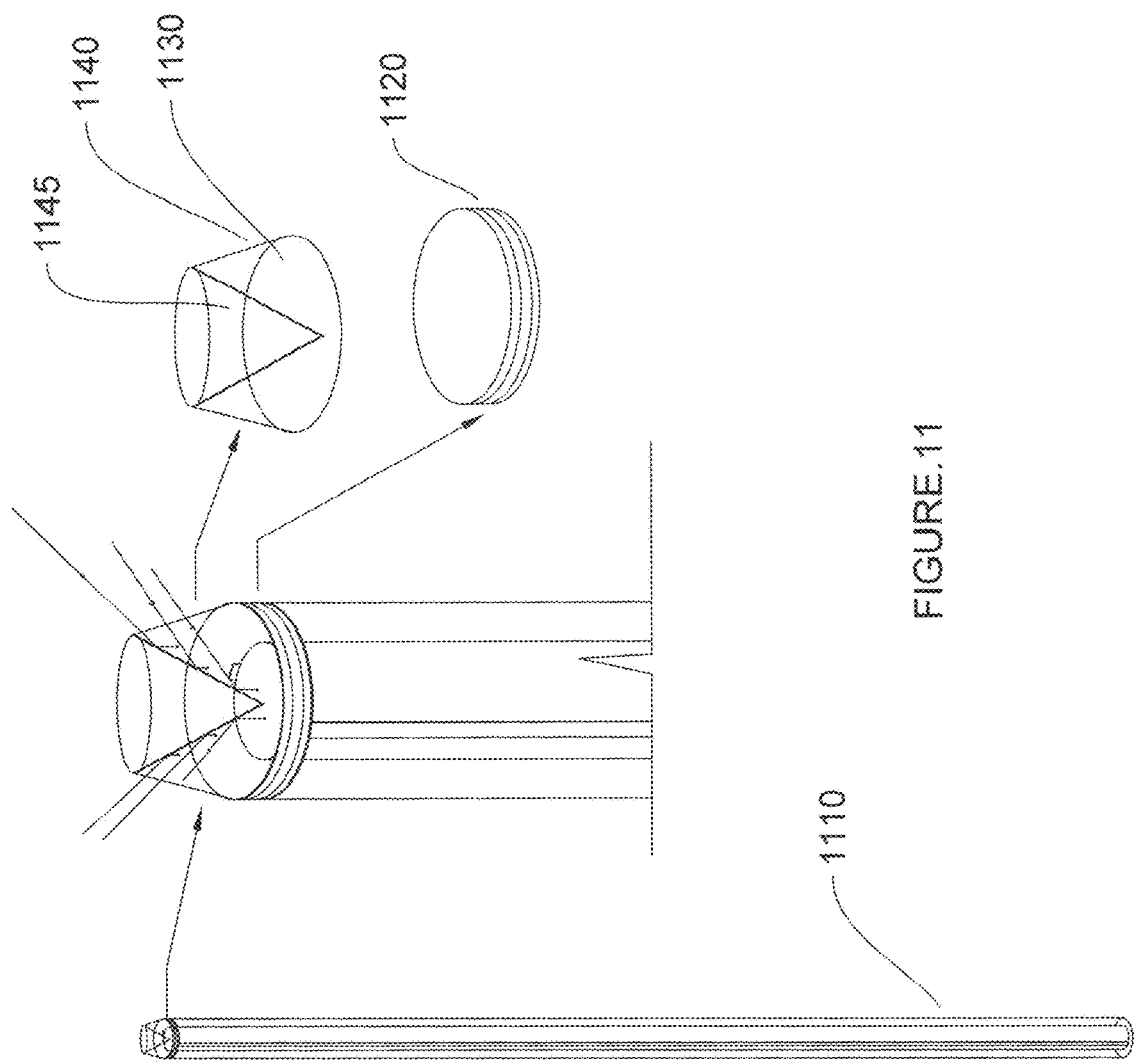
FIG. 11 illustrates a lid for a cutout solar panel assembly according to an embodiment.

FIG. 11 illustrates a plurality of lids 1120 for enclosing each of the cutouts or openings (or the tubes 10) in the solar panel assembly 1110 described with reference to FIGS. 8A-9D. The lid 1120 can be configured to substantially enclose each the cutouts or the tubes. Similar to the filters/electrochromic coating/augmenting layer for the top cover sheet described with reference to FIGS. 2A-2B, each lid 1120 may also have three layers, namely, a UV/IR filtering layer, electrochromic layer and augmenting layer. A light deflector 1140 may be positioned over the lid 1120. The light deflector 1140 may include a reflector cone 1145 placed inside a conical glass prism 1130. The cone 1145 deflects all the rays of sunlight that hit it such that they fall towards the cylindrical gap thereby enhancing the probability of total internal reflection.

Figure 12:
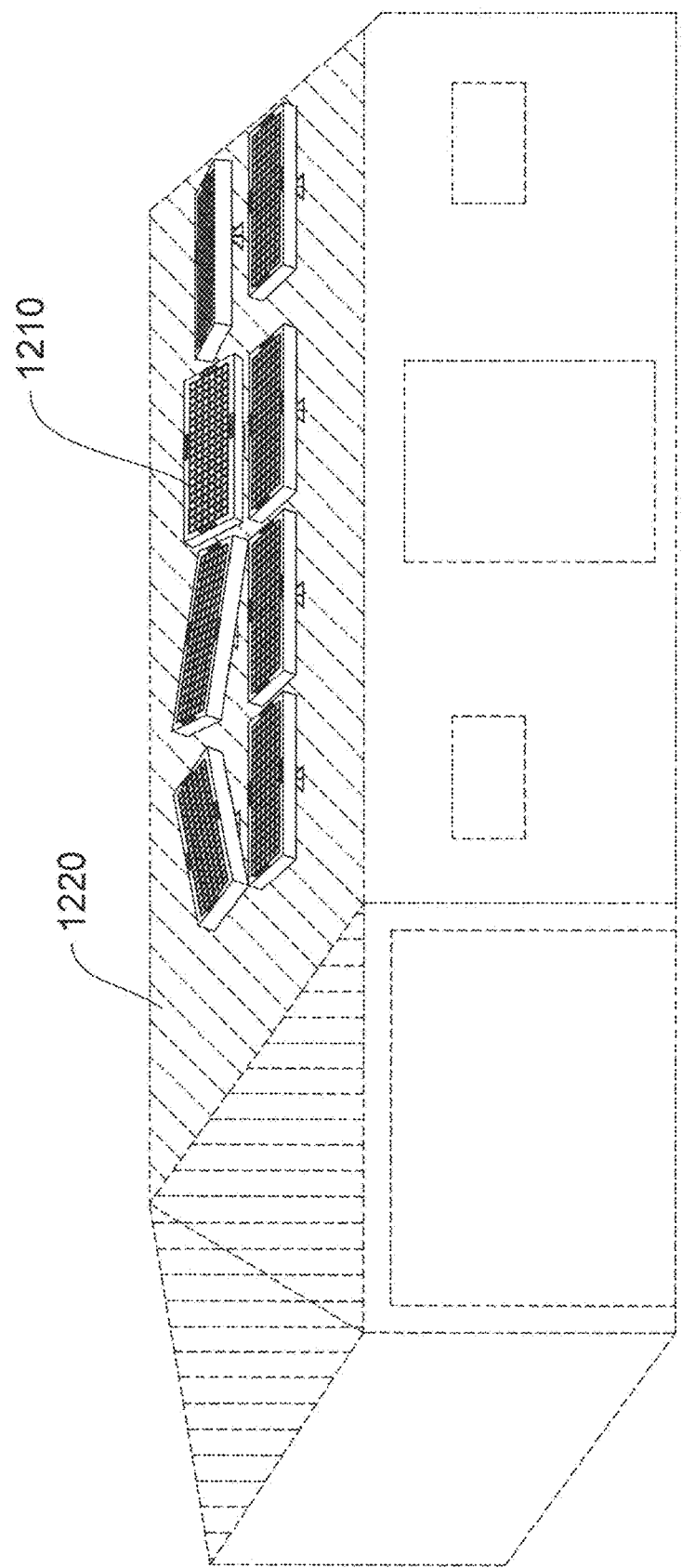
FIG. 12 illustrates a PV system according to an embodiment positioned on a rooftop.

FIG. 12 shows a PV system 1210 described herein mounted on top of a building 1220. The solar panel assemblies can be tilted to all directions, the angle of tilt being controlled by the light sensors attached on the walls of the housing and on the top surface of individual cylindrical tubes and working with pivots on the housing or tubes as described herein According to an embodiment, a method for optimizing the harvesting of solar energy includes: providing a photovoltaic system for receiving the solar energy, the photovoltaic system comprising: a housing; and a solar panel assembly within the housing. The solar panel assembly includes one or more tubes, or a tubular cutout in a honey comb arrangement. Each tube includes one or more solar panels. The recycling of incident light in the tube is enabled. The light can be intermittently or continuously recycled. The amount of reflections can be modified by the percentage of reflection, non-planar surface types of the panels, the amount of reflecting areas and other methods to optimize the desired amount of reflection to maximize electricity generation.

An optimal temperature may be maintained inside the housing by circulation of fluid inside or outside the housing. In the honey comb embodiment, the material may be frozen to prevent heating or may have micro tubules to circulate air or liquid coolant.

The panels may include one or more photovoltaic cells (semi-conductors). One or more of the panels is a non-planar panel. The panels can be textured and corrugated. The panels can include cells on its top and the bottom surfaces overlying a reflecting base at the top and the bottom. The panels can be spherical, globular with wedge cuts, pyramidal, circular, semi-circular, diamond shape, oval shape, circular or any such combination.

Production of electrical energy may be optimized by providing a photovoltaic system according to one or more embodiments. According to an embodiment, an intermittent stimulation of the photovoltaic cells may be facilitated by intermittent graded opacification of the top cover plate for the housing or the lids of the tubes by any other technique known in the art.

The PV system, according to one or more embodiments described herein, may be implemented as fixed ground units or as mobile units.

According to an embodiment, the electrical energy generated by the PV system, according to the embodiments described herein, can be collected, stored (for example, in a battery) and distributed through specialized methods already in use.

According to one or more embodiments, there will be more energy output per unit area of the PV system. This may facilitate the widespread use and acceptance of solar technology for consumer, commercial, defense, scientific, space technologies, automobiles, and industrial purposes.

It should be understood that, as used herein, "first," "second," "third," etc., and "top" and "bottom" are arbitrarily assigned and are merely intended to differentiate between two or more panels, their positions, etc., as the case may be, and does not indicate any particular orientation or sequence. Furthermore, it is to be understood that the mere use of the term "first" does not require that there be any "second," and the mere use of the term "second" does not require that there be any "third," etc.

Therefore, the present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is, therefore, evident that the particular illustrative embodiments disclosed above may be altered or modified and all such variations are considered within the scope and spirit of the present invention. While apparatus and methods are described in terms of "comprising," "containing," or "including" various components or steps, the apparatus and methods also can "consist essentially of" or "consist of" the various components and steps. In particular, every range of values (of the form, "from about a to about b," or, equivalently, "from approximately a to b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an", as used in the claims, are defined herein to mean one or more than one of the element that it introduces. If there is any conflict in the usages of a word or term in this specification and one or more patent(s) or other documents that may be incorporated herein by reference, the definitions that are consistent with this specification should be adopted. From the foregoing description it will be understood by those skilled in the art that many variations or modifications in details of design, construction and operation may be made without departing from the present invention as defined in the claims.

The invention claimed is:

1. A photovoltaic (PV) system comprising:
    a housing; and
    a solar panel assembly supported within the housing,
        wherein the solar panel assembly comprises:
            a plurality of elongate tubes arranged within the housing, wherein the housing has a base and four sidewalls, wherein each of the sidewalls is perpendicular to the base, wherein the tubes extend perpendicular to the base, wherein when the base of the housing is along an x-axis, the tubes are vertically oriented along a y-axis,
            wherein two or more solar panels are arranged along a central axis of each tube,
            wherein an external surface of each of the solar panels comprises a combination of photovoltaic cells and reflective surfaces, and wherein each solar panel includes alternating photovoltaic cells and reflective surfaces
            wherein an inside surface of each of the tubes consists of a lining or coating of a reflective material, and
            wherein the plurality of tubes are arranged within the housing to facilitate recycling of incident light entering from a top of the respective tube.

2. The PV system according to claim 1, further comprising a first set of light sensors positioned along one or more sides of a top surface of the housing to pivot the housing towards a source of light.

3. The PV system according to claim 2, wherein the housing includes a transparent top cover plate to allow substantially all incident light reach the solar panel assembly.

4. The PV system according to claim 3, wherein the top cover plate sealably encloses the solar panel assembly within the housing.

5. The PV system according to claim 1, wherein a base of the housing comprises a pivot.

6. The PV system according to claim 3, wherein at least one of the tubes is provided with a lid, wherein the lid includes a second set of light sensors.

7. The PV system according to claim 6, wherein the top cover plate and the lid include two or more layers selected from the group consisting of: i) a filter or coating layer for allowing only optimal light bands to penetrate the housing; ii) an electrochromatic coating layer, and iii) an augmentation layer for augmenting the incident light.

8. The PV system according to claim 1, wherein each of the tubes is tightly packed within the housing such that there is substantially no gap between them, and wherein an outside surface of each of the tubes is lined or coated with a reflective material.

9. The PV system according to claim 1, wherein each of the solar panels is substantially C-shaped.

10. A method for a optimizing the harvesting of solar energy comprising:
    providing a photovoltaic system according to claim 1; and
    facilitating recycling of incident light within each of the tubes, wherein the light is intermittently or continuously recycled.

* * * * *